(12) United States Patent
Friza

(10) Patent No.: US 11,223,904 B2
(45) Date of Patent: Jan. 11, 2022

(54) METHOD FOR MANUFACTURING AN OPENING STRUCTURE AND OPENING STRUCTURE

(71) Applicant: Infineon Technologies AG, Neubiberg (DE)

(72) Inventor: Wolfgang Friza, Villach (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 16/559,646

(22) Filed: Sep. 4, 2019

(65) Prior Publication Data

US 2020/0015017 A1 Jan. 9, 2020

Related U.S. Application Data

(62) Division of application No. 14/285,839, filed on May 23, 2014, now Pat. No. 10,469,948.

(51) Int. Cl.
*H01L 29/84* (2006.01)
*H04R 7/14* (2006.01)
(Continued)

(52) U.S. Cl.
CPC ........... *H04R 7/14* (2013.01); *B81C 1/00603* (2013.01); *H04R 19/005* (2013.01); *H04R 31/00* (2013.01);
(Continued)

(58) Field of Classification Search
CPC ...... H04R 19/005; H04R 19/04; H04R 31/00; H04R 7/14; H04R 19/02; H04R 31/003; H04R 2201/003; B81C 1/00603; B81B 2201/0257; B81B 2203/0353; H01L 21/67121; H01L 21/6734; H01L 23/3114; H01L 2023/4031; H01L 2023/405; H01L 23/49805; H01L 24/01; H01L 33/48; H01L 2221/68313; H01L 2223/54486; H01L 2224/01; H01L 2224/04105; H01L 2225/06582; H01L 2924/15; H01L 23/3675; H01L 31/0203; H01L 31/048; H01L 35/32; H01L 2223/6677; H01L 2223/6694; H01L 41/053; H01L 41/23; H01L 2924/17151; H01L 2924/181; H01L 23/3107; H01L 23/5389; H01L 2225/1035

See application file for complete search history.

(56) References Cited

U.S. PATENT DOCUMENTS 5,877,791 A * 3/1999 Lee .................. B41J 2/1603
    347/63
2007/0092983 A1* 4/2007 Weigold ............. B81C 1/00944
    438/52

(Continued)

*Primary Examiner* — Samuel Park
(74) *Attorney, Agent, or Firm* — Viering, Jentschura & Partner MBB

(57) ABSTRACT

A method for manufacturing an opening structure is provided. The method may include: forming a patterned mask over a first side of a carrier; forming material over the first side of the carrier covering at least a portion of the carrier; forming a first opening in the carrier from a second side of the carrier opposite the first side of the carrier to at least partially expose a surface of the patterned mask; and forming a second opening in the material from the second side of the carrier using the patterned mask as a mask.

14 Claims, 15 Drawing Sheets

(51) Int. Cl.
*H04R 31/00* (2006.01)
*B81C 1/00* (2006.01)
*H04R 19/00* (2006.01)
H04R 19/02 (2006.01)
H04R 19/04 (2006.01)

(52) U.S. Cl.
CPC ............... *B81B 2201/0257* (2013.01); *B81B 2203/0353* (2013.01); *H04R 19/02* (2013.01); *H04R 19/04* (2013.01); *H04R 31/003* (2013.01); *H04R 2201/003* (2013.01)

(56) References Cited

U.S. PATENT DOCUMENTS

| | | | |
|---|---|---|---|
| 2007/0165888 A1* | 7/2007 | Weigold | H04R 19/005 |
| | | | 381/174 |
| 2008/0006093 A1* | 1/2008 | Ueya | H04R 19/04 |
| | | | 73/724 |
| 2009/0026561 A1* | 1/2009 | Reichenbach | G01L 9/0073 |
| | | | 257/416 |
| 2010/0206076 A1* | 8/2010 | Zoellin | G01P 15/0802 |
| | | | 73/514.32 |
| 2010/0330722 A1* | 12/2010 | Hsieh | G01P 15/125 |
| | | | 438/53 |
| 2012/0326249 A1* | 12/2012 | Rombach | B81C 1/00984 |
| | | | 257/416 |

* cited by examiner

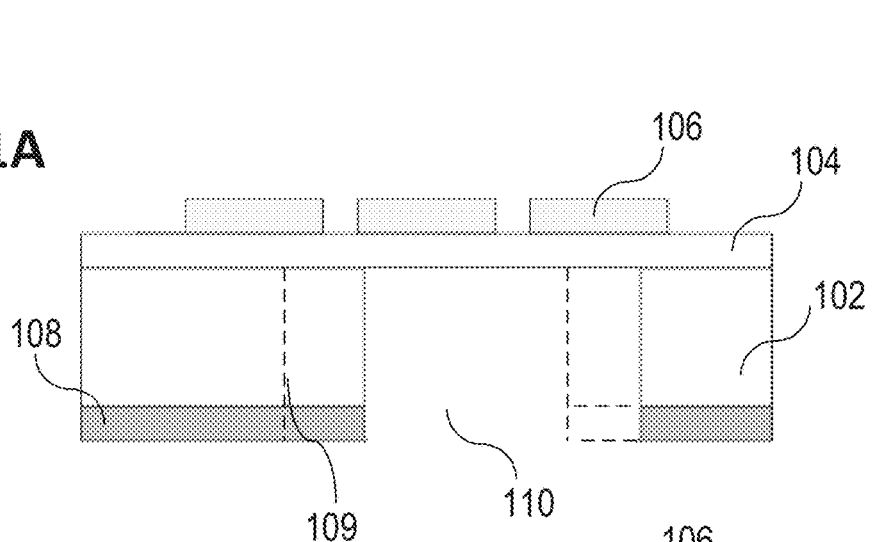
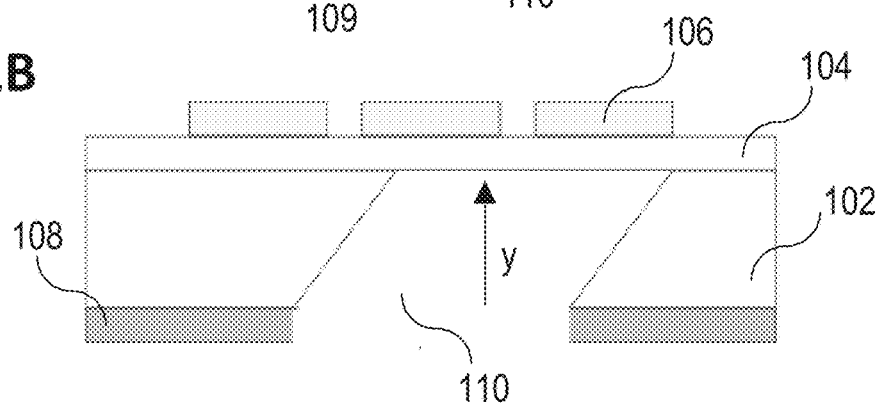
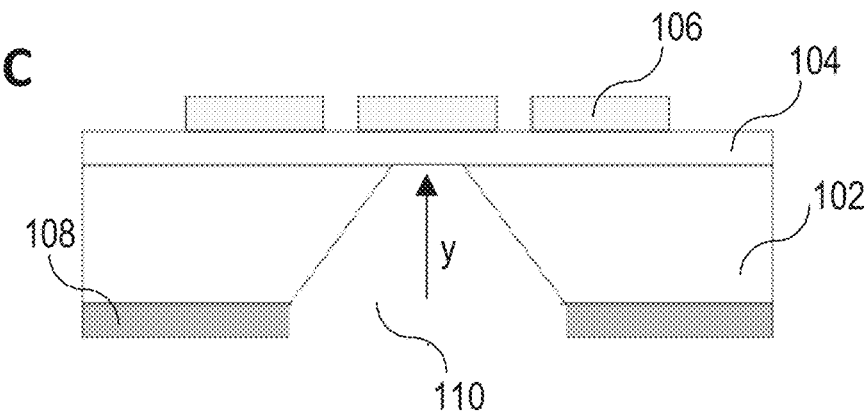
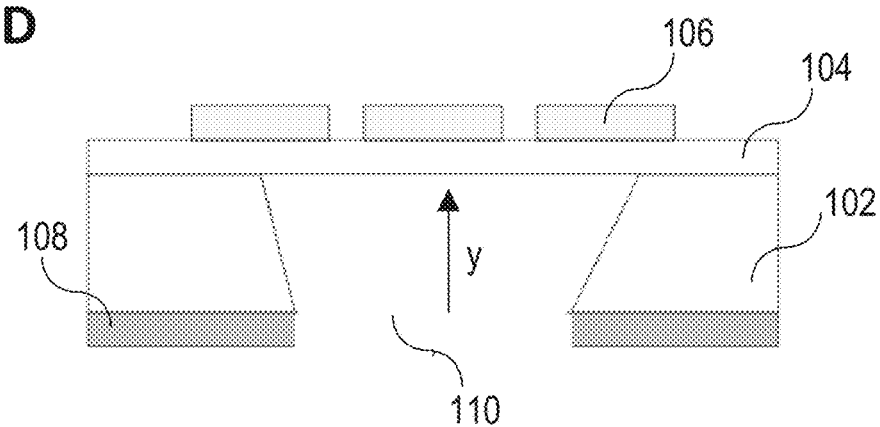

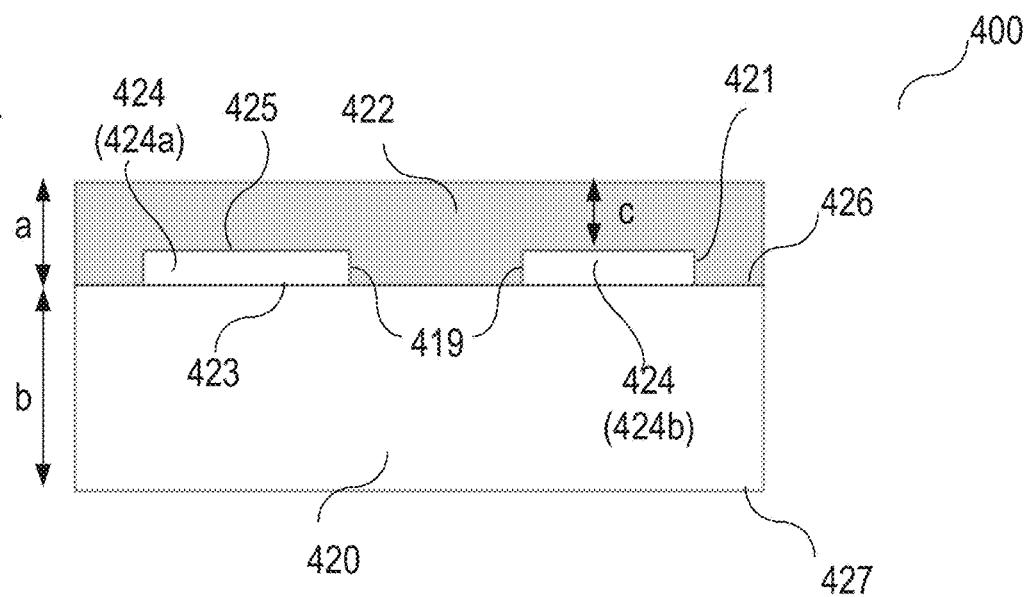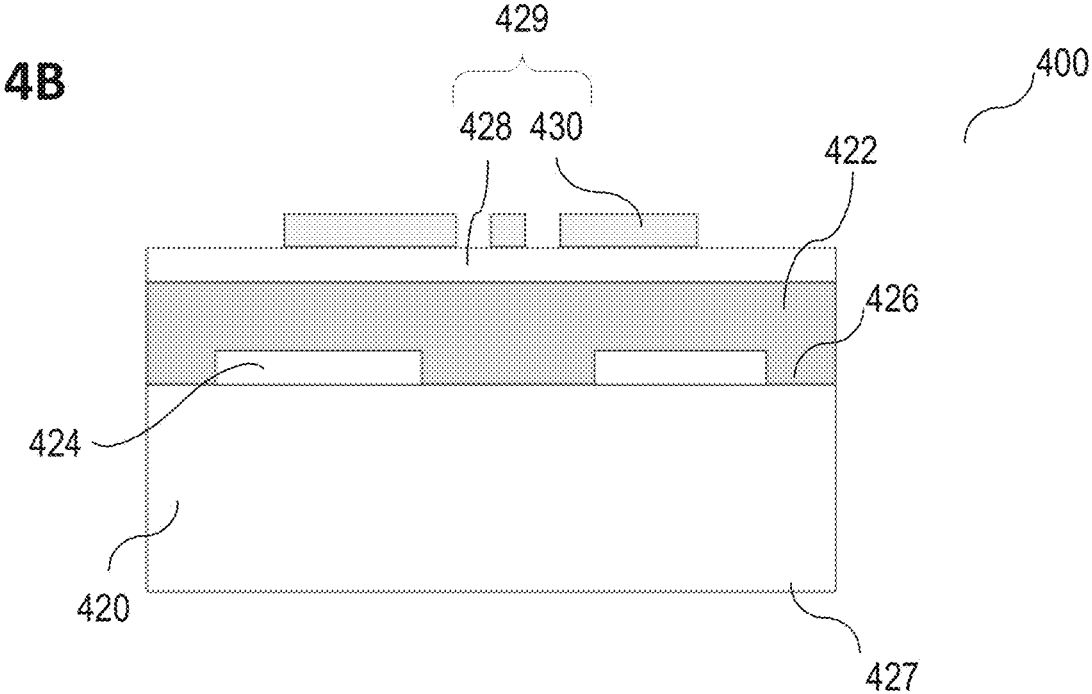

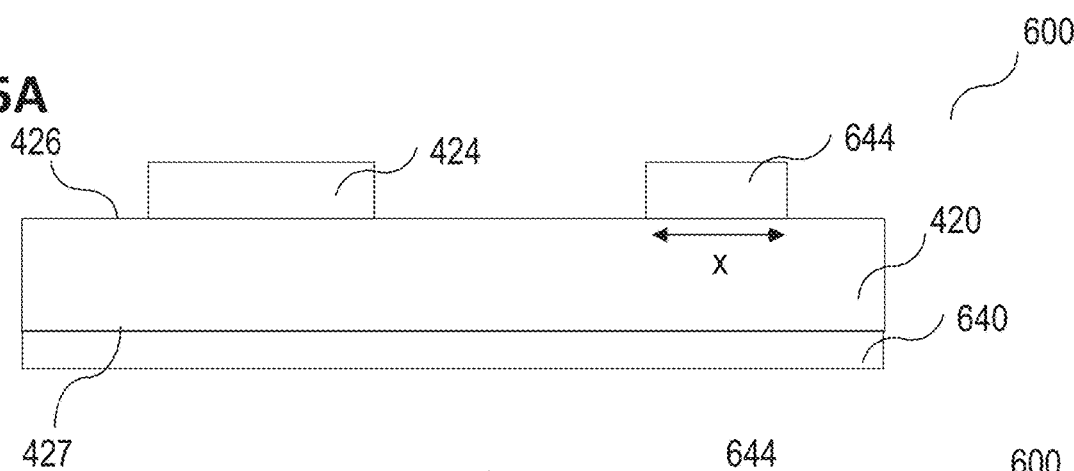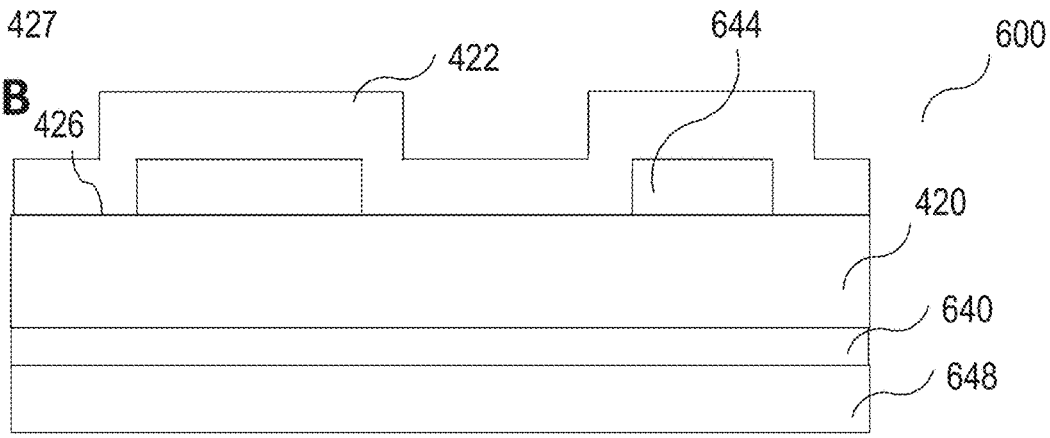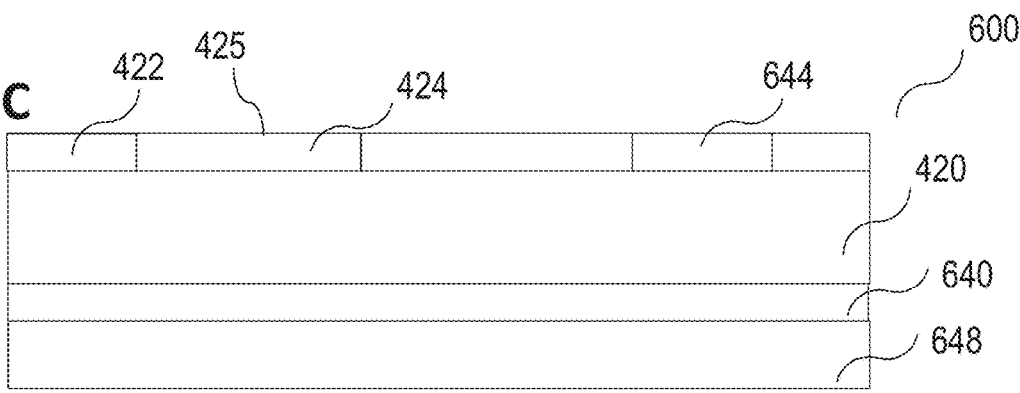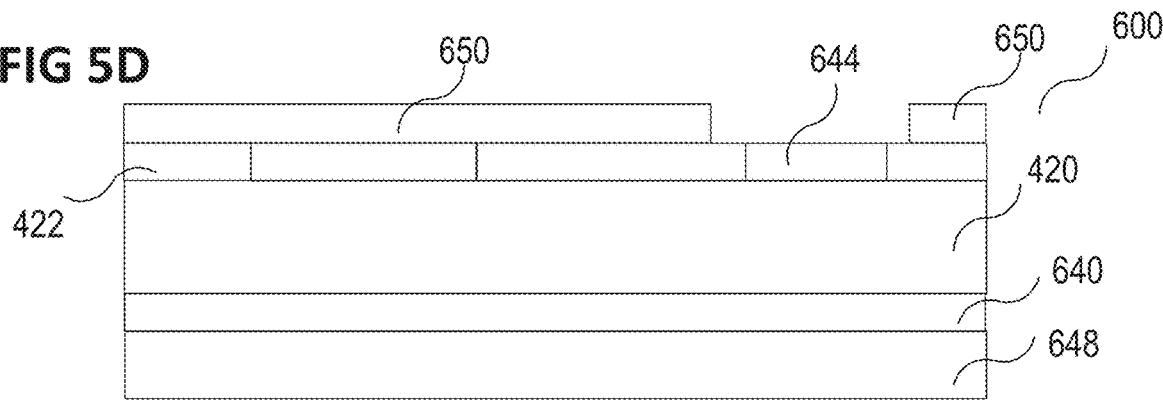

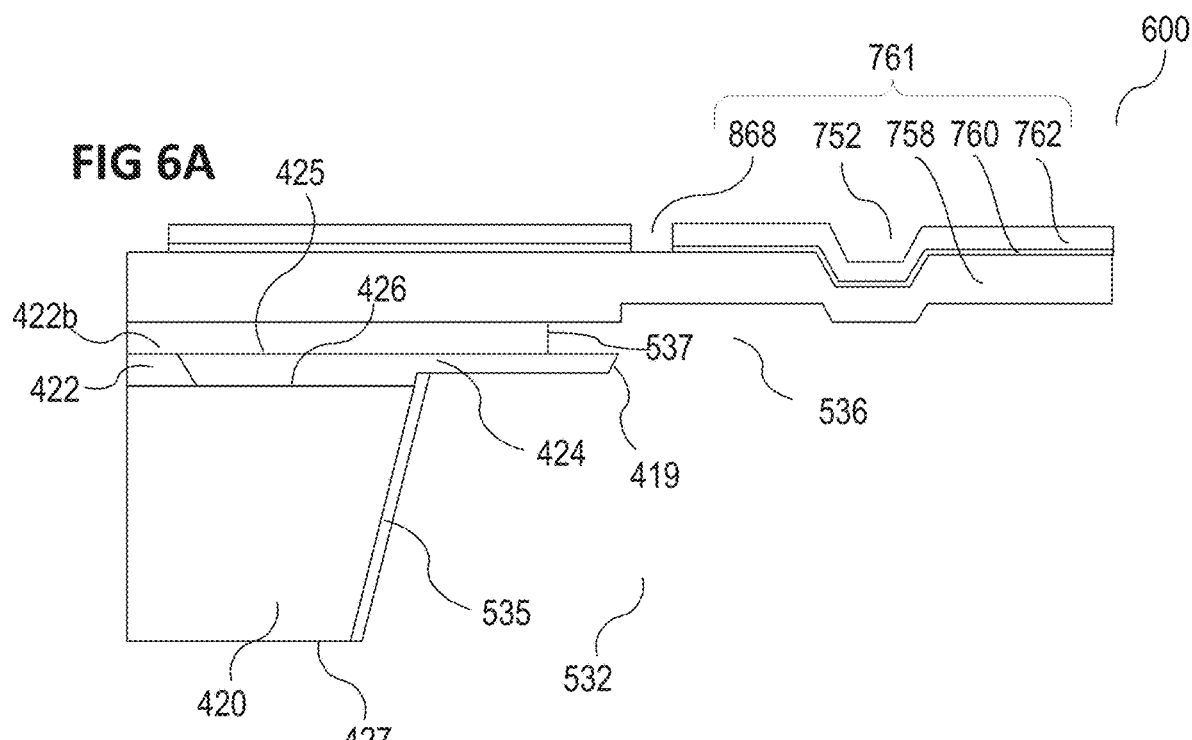
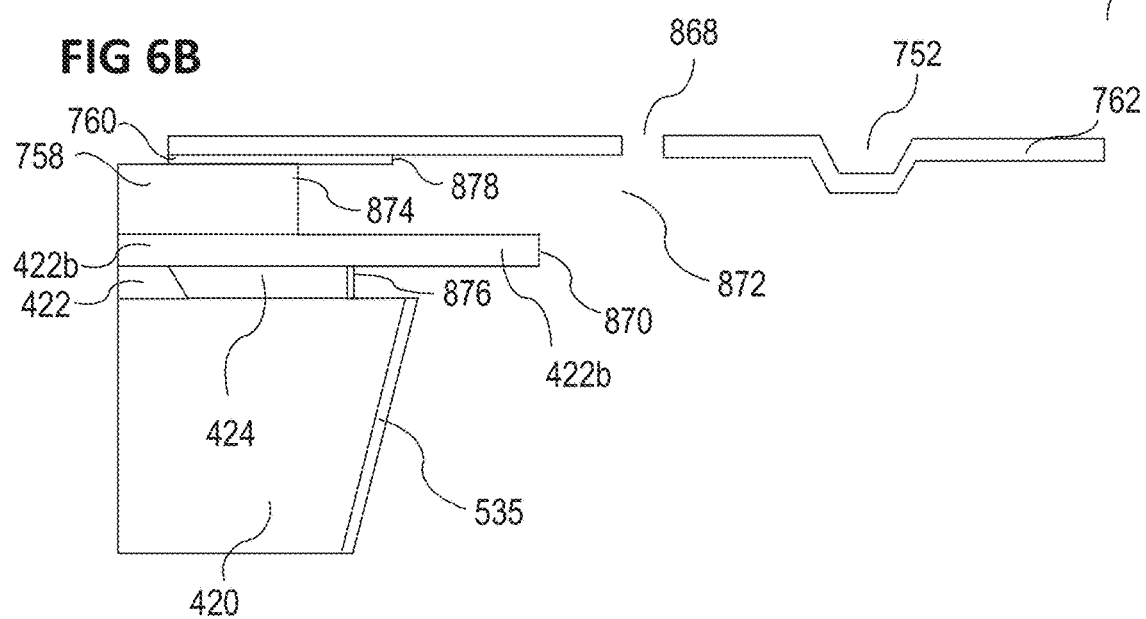

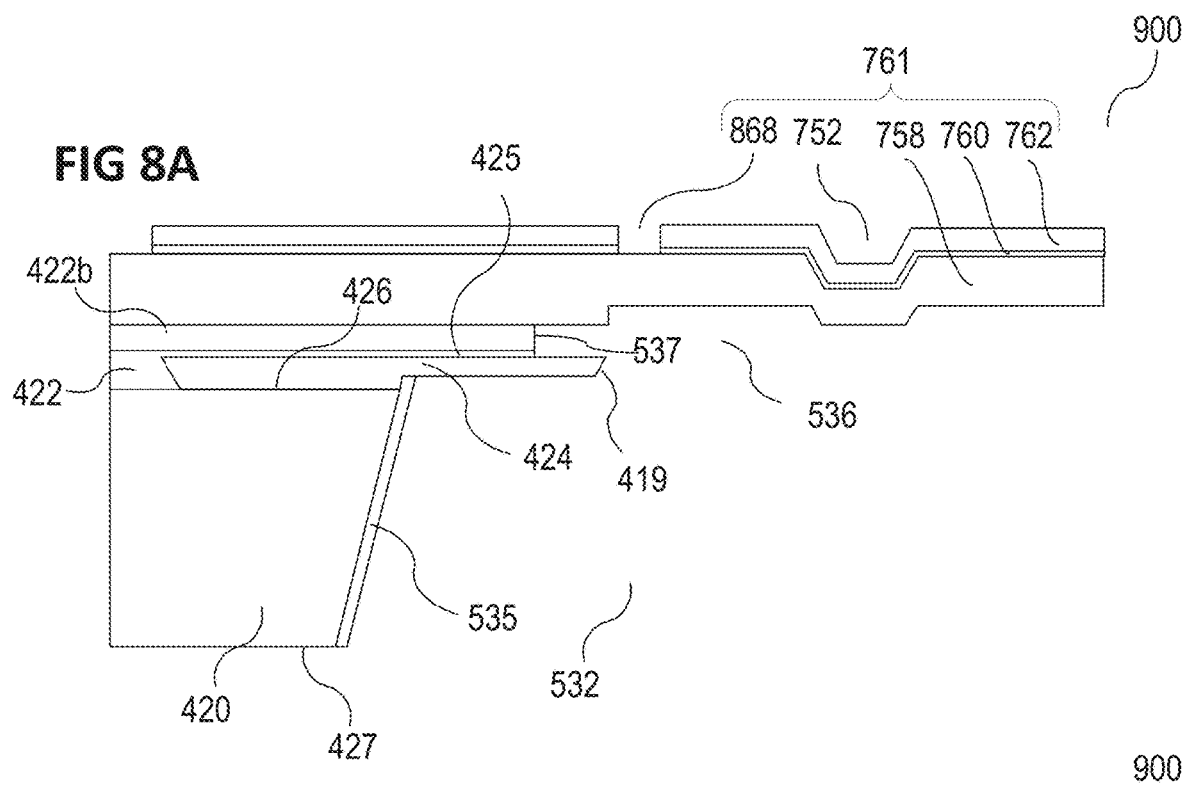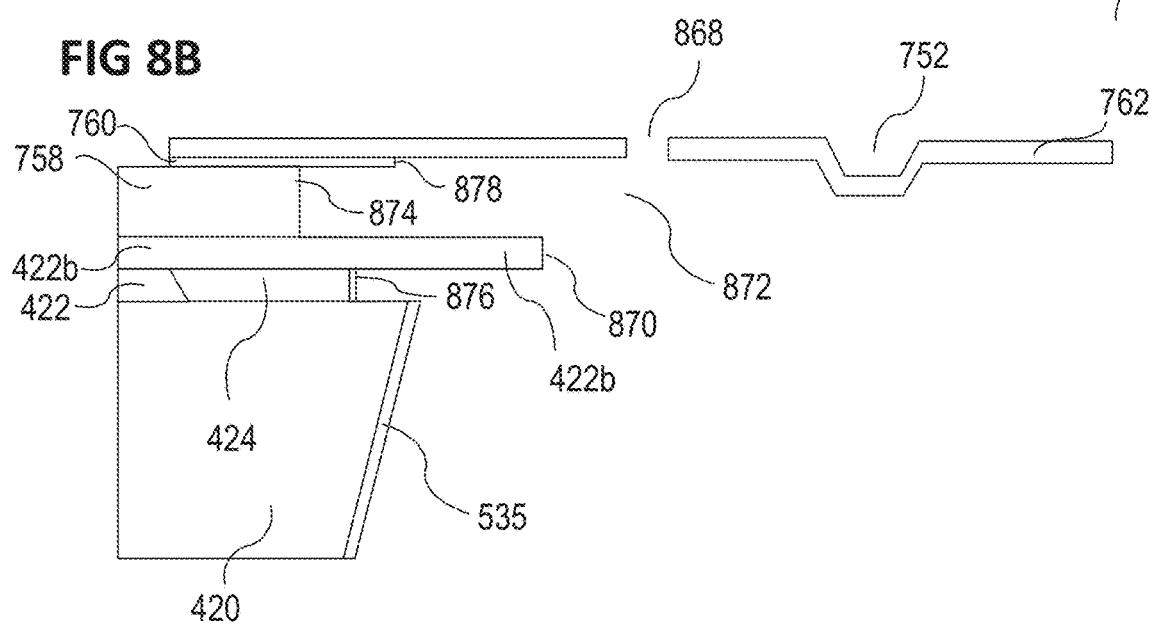

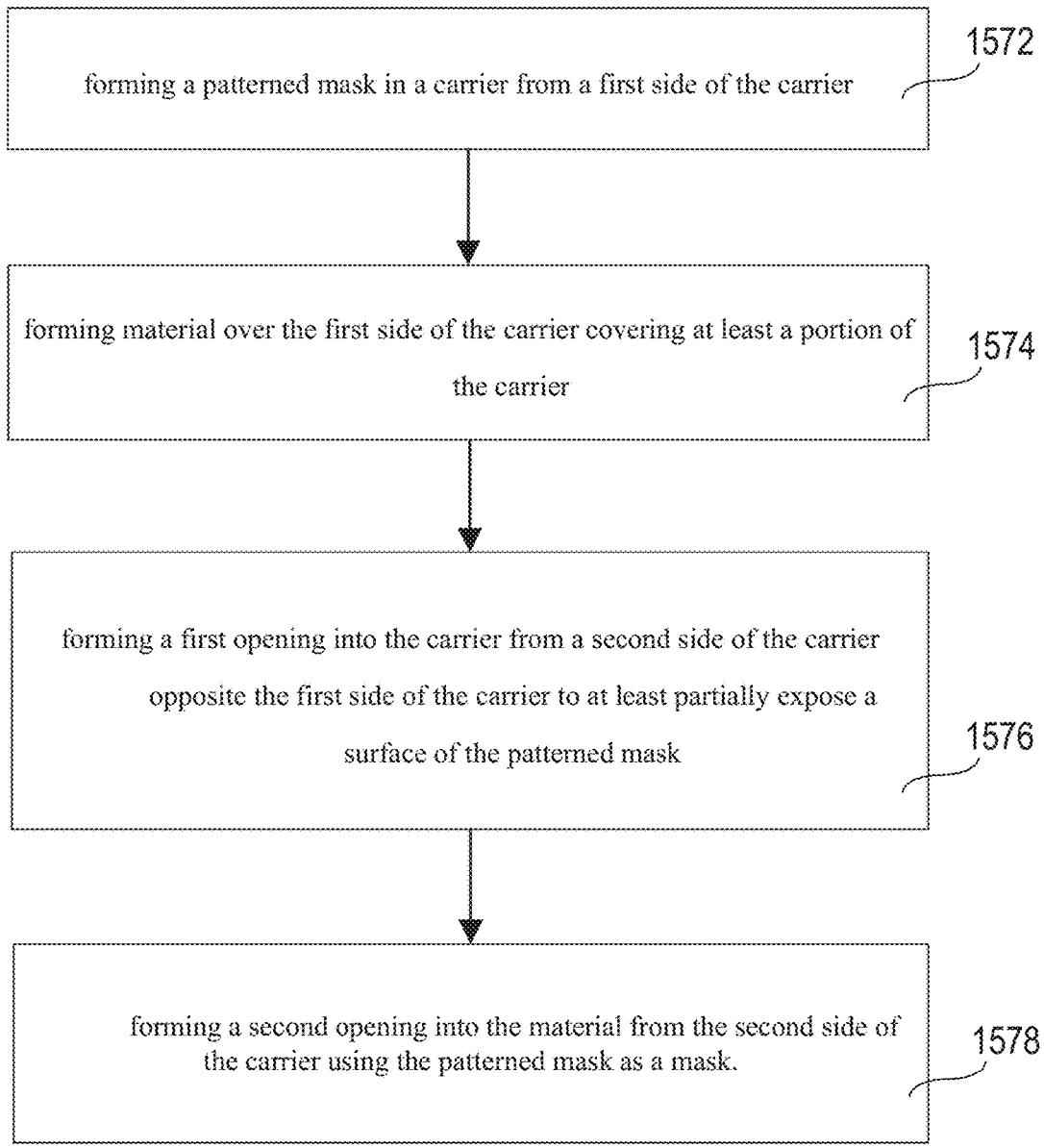

METHOD FOR MANUFACTURING AN OPENING STRUCTURE AND OPENING STRUCTURE

RELATED APPLICATION(S)

This application is divisional of U.S. patent application Ser. No. 14/285,839, filed May 23, 2014, and entitled "METHOD FOR MANUFACTURING AN OPENING STRUCTURE AND OPENING STRUCTURE", the contents of which are incorporated herein by reference in their entirety.

TECHNICAL FIELD

Various embodiments relate generally to a method for manufacturing an opening structure and to an opening structure.

BACKGROUND

During manufacture of microelectromechanical systems (MEMS) or other semiconductor elements, an etching of deep openings, trenches or cavities from a back side of a substrate/carrier extending to a front side of the substrate may often be required.

For a good functionality of the final element, it may be essential that a relative positioning (adjustment) of a backside mask with respect to structures on the front side of the substrate is precise. Furthermore, the positioning of structures defined by the mask on the back side of the substrate may need to be transferred precisely to the front side of the substrate, and a shape of the structures defined on the back side may need to be conserved during the transfer from the back side to the front side of the substrate, such that openings/trenches/cavities having been formed in the substrate from the backside and opening up on the front side of the substrate are precisely positioned with respect to the front side structures and have an intended shape.

Such aspects may for example be relevant in the manufacturing of silicon microphones or loudspeakers.

SUMMARY

A method for forming an opening structure is provided. The method may include: forming a patterned mask over a first side of a carrier; forming material over the first side of the carrier covering at least a portion of the carrier; forming a first opening in the carrier from a second side of the carrier opposite the first side of the carrier to at least partially expose a surface of the patterned mask; and forming a second opening in the material from the second side of the carrier using the patterned mask as a mask.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A to FIG. 1D show cross sections of devices with misaligned opening structures;

FIG. 4A to FIG. 4D show a process flow for a method for forming an opening structure in accordance with various embodiments;

FIG. 5A to FIG. 5H show a process flow for a method for forming an opening structure in accordance with various embodiments;

FIG. 6A and FIG. 6B show cross sections of opening structures according to various embodiments;

FIG. 8A and FIG. 8B show cross sections of opening structures according to various embodiments;

FIG. 12 shows a schematic diagram of a method for forming an opening structure in accordance with various embodiments.

DESCRIPTION

Figure 2A:
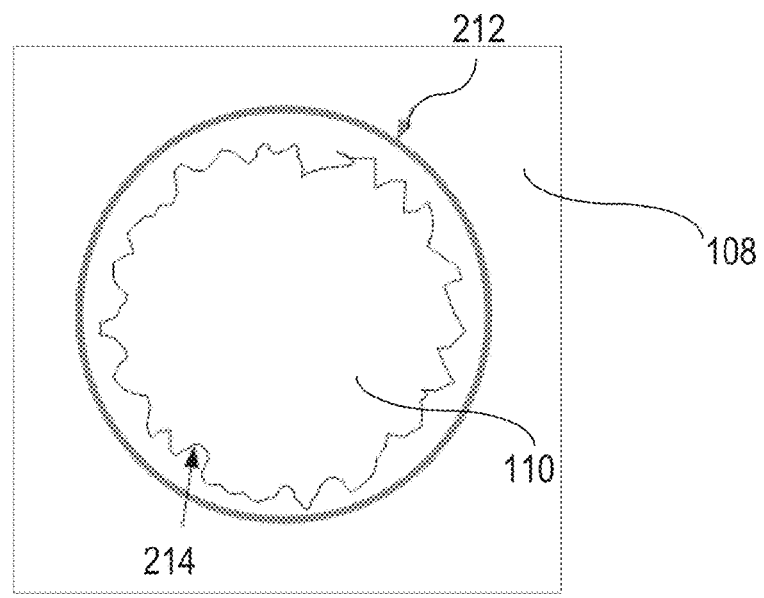
FIG. 2A and FIG. 2B show bottom views of faulty openings.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

FIG. 1A to FIG. 1D show opening structures in devices 100. Each of the figures shows: a substrate 102, a mask 108 arranged below the substrate 102 on a back side of the substrate 102, a top layer 104, for example a silicon oxide layer 104, arranged over the substrate 102 on a front side of the substrate 102 opposite the back side of the substrate 102, a structure 106 arranged over the top layer 104 on the front side of the substrate 102, and an opening 110 extending through the substrate 102 from the back side of the substrate 102 to the front side of the substrate 102.

Relative positioning of the back side mask 108 with respect to the front side structure 106, using tools presently available, may reach only a low precision of about 5 µm. This is shown in FIG. 1A, where the opening 110 in the substrate 102 is misplaced laterally (parallel to the front side and the back side, respectively), such that the structure 106 and the opening 110 are misaligned. An optimal relative positioning of the opening 110 and the front side structure 106 is shown as dashed lines 109.

In various embodiments, the substrate 102 may have a thickness of about 300 μm or more, in various other embodiments the thickness of the substrate 102 may be below 300 μm. The opening 110 may extend from the back side of the substrate 102 to the front side of the substrate 102 (thereby exposing a portion of a surface of the top layer 104. It may be etched using plasma etching, for example using a Bosch deep reactive ion etching process. The etching process etching such a large depth may cause the etched structure (e.g. the opening 110) to be tilted. In other words, whereas one end of the opening 110 close to the mask 108 may be very well aligned with the mask 108, another end of the opening 110, which is further away from the mask 108 by a distance y in a direction indicated by an arrow in FIG. 1B, may be laterally offset. The offset may for example be linear towards one lateral direction with increasing distance y from the mask 108. Such an offset may also be referred to as tilting. The tilting may cause an offset of structures defined by the mask 108 with respect to the front side structure 106. The magnitude and the direction of the tilting may depend on a state of an etching chamber and may not be stable.

As shown in FIG. 1C and FIG. 1D, etching of the opening 110 by means of plasma etching may cause a narrowing (FIG. 1C) or a broadening (FIG. 1D) of the opening 110 in the direction y in FIG. 1C and FIG. 1D, generally a change in size. In other words, near the front side of the substrate 102, the opening 110 may be narrower or broader than defined by the mask 108 on the back side of the substrate 102. This may cause a misalignment of the structures defined by the mask 108 with respect to the front side structure 106. The magnitude and the direction of the narrowing/broadening may depend on a state of an etching chamber and may not be stable.

FIG. 2A shows a view of the device 100 as seen from the bottom in one of FIG. 1A to FIG. 1D. It shows that spontaneous polymerization during the etching of the opening 110 may cause a roughening of walls of the opening 110. This may cause a rough and/or irregular end 214 of the opening 110 on the front side of the substrate 102, despite a smooth structure 212 defined by the mask 108 on the back side of the substrate 102. The magnitude of the roughening may depend on a state of an etching chamber and may not be stable.

Figure 2B:
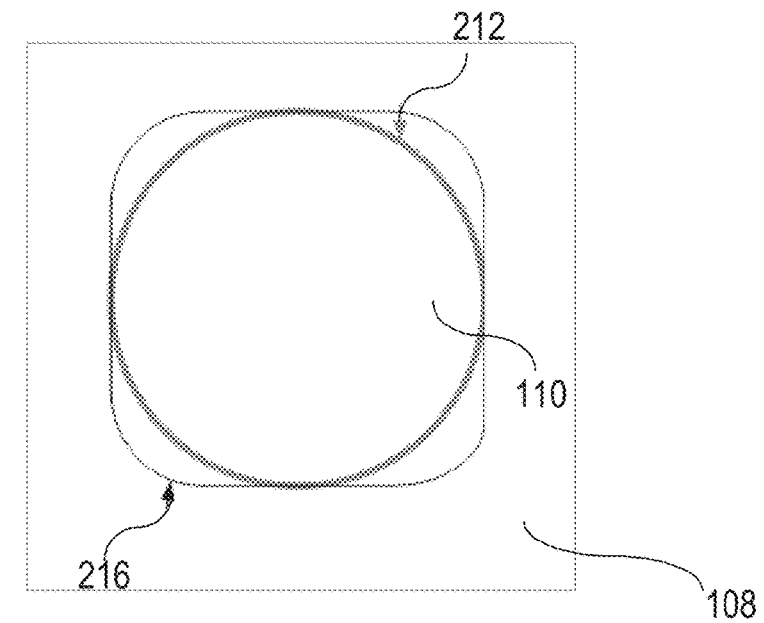

Alternatively, wet-chemical etching may be used for etching the opening 110 in the device 100 according to FIG. 1A. Even though wet-chemical etching may be cheap, large variations between sizes of the structures defined on the back side of the substrate 102 by the mask 108 and structures obtained on the front side of the substrate 102 by the wet-chemical etching may be caused. Furthermore, a change in shape of the structures defined on the back side of the substrate 102 by the mask 108 and structures obtained on the front side of the substrate 102 by the wet-chemical etching may occur due to an etching rate that depends on a crystallographic structure and orientation of the substrate 102. This is shown in FIG. 2B, where the round structure 212 is defined by the mask 108 on the back side of the substrate 102, and a quadratic structure with rounded corners 216 is obtained on the front side of the substrate 102. This change in shape may be so severe as to be prohibitive to using wet-chemical etching for forming the openings 110 in silicon microphones or (e.g. micro) loudspeakers.

Figure 3A:
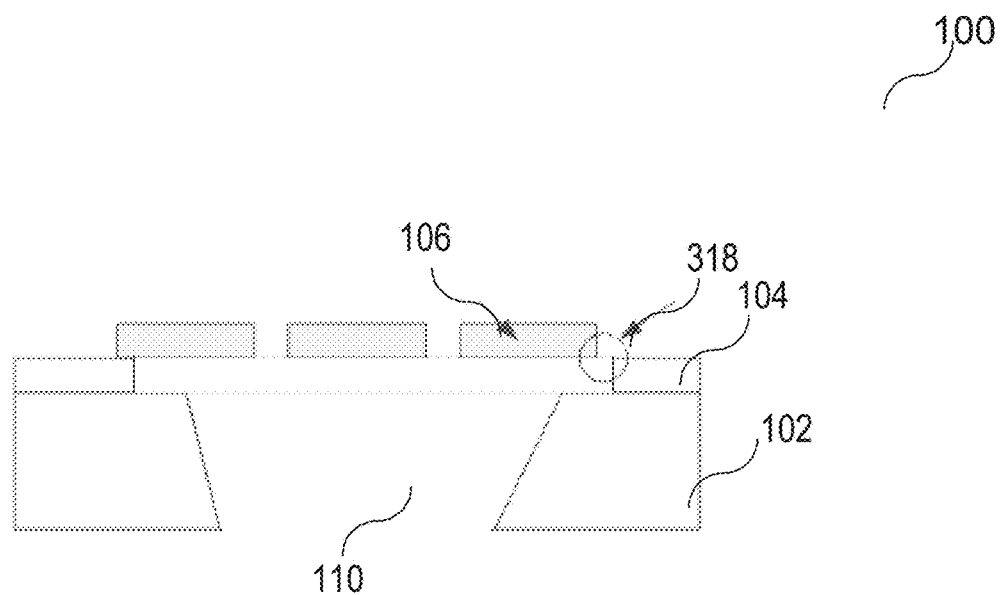
FIG. 3A and FIG. 3B show cross sections of devices with misaligned opening structures.
Figure 3B:
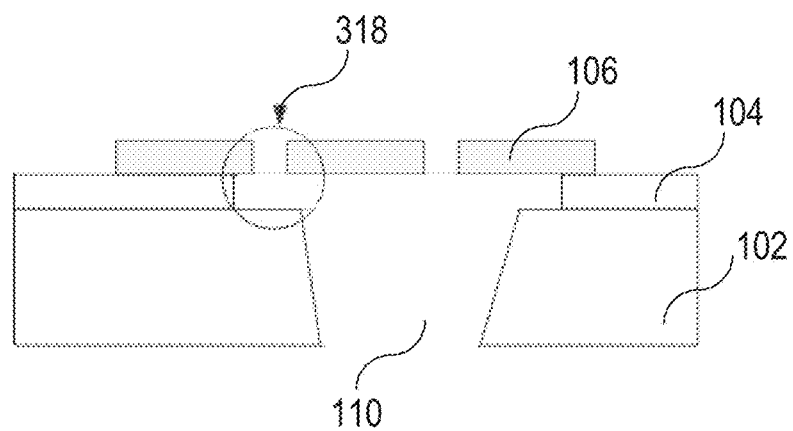

FIG. 3A and FIG. 3B show two possible effects of misaligned structures formed by the mask 108 on the back side of the substrate 102 and incorrectly transferred by means of etching to the front side of the substrate 102, as described for the examples in FIG. 1A to FIG. 1D. In FIG. 3A and FIG. 3B, the device may be a silicon microphone (some parts like a gap, counter electrode and the like are not shown), with the front side structure 106 including or being a membrane. The opening 110 may be etched, for example by etching of the substrate 102, using for example plasma etching, for example Bosch etching, and/or wet etching, and of the top layer 104, for example using wet-chemical etching using hydrogen fluoride and/or using plasma etching. The shape of the opening 110 in the substrate 102, i.e. its edge on the front side of the substrate 102, may define a shape of the top layer 104 (i.e. the layer of silicon oxide 104 as described above, for example), for example a silicon oxide layer, which serves as support for the membrane 106. In a case like it is shown in FIG. 3A, a widening of the opening 110 from the back side towards the front side of the silicon microphone 100 may cause the top layer 104 (the supporting oxide layer 104) to be etched up to a point where the top layer 104 is not in contact with the membrane 106 anymore (see e.g. faulty region 318 in FIG. 3A) and thus cannot support the membrane 106. Such a lack of support of the membrane 106 means that the silicon microphone will become defective. As shown in FIG. 3B, the misaligned structures (in this case a lateral offset) may also lead to a situation where the substrate 102, for example a silicon substrate, is not etched away in a region opposite a vent hole in the membrane 106 (see e.g. faulty region 318 in FIG. 3B). An edge of the substrate 102 covering the vent hole may cause a wrong acoustic frequency response.

Furthermore, the rough end 214 of the opening 110 on the front side of the substrate 102, as shown in FIG. 2A, may lead to a decrease in robustness of the device 100, for example the silicon microphone.

In a device, one or more of the above described problems may be present at the same time.

At present, satisfactory means to overcome the problems described above may not exist. Complex measurements checking the alignment of the back side mask 108 with respect to the front side may be conducted, and wafers outside specifications may be re-worked. This may cause additional production overhead. Furthermore, with the wafer, for example an 8" wafer, typically having been thinned to its final thickness already, an extra handling may increase a risk of wafer damage.

In order to adjust for a change in size and/or tilting of the openings 110 defined by the structured mask 108, measurements may be conducted and analyzed statistically. Results may be used to structure the mask 108 in a way which, on average, may lead to the desired positioning of the structure on the front side of the substrate 102. In other words, in order to make the structure end up in the desired location on the front side of the substrate 102, despite an offset expected from statistical evaluation of measurements on a batch of devices of a production line, the mask 108 is shifted opposite the expected shift by the expected amount. Similarly, a widening/narrowing of the structure on the front side of the substrate 102 with respect to the back side of the substrate 102, determined from a statistical analysis of measured structure sizes on the back side of the substrate 102 and the front side of the substrate 102, may be attempted to be employed for leading to the desired structure on the front side of the substrate 102 by narrowing/widening the structure of the mask 108 by a corresponding amount/factor.

The statistical nature of the above described errors, the applied corrections and further production uncertainties may lead to faulty systems despite the applied corrections. For a detection of faulty systems, measurements may be necessary that require dedicated measurement systems and the measuring of all wafers of a given lot of a plurality of wafers.

The roughness of the end 214 of the opening 110 on the front side of the substrate 102 may be smoothed to some extent, but not completely avoided by the plasma opening etching process, because spontaneous passivation/polymerization may not be controlled. An etching process reducing spontaneous passivation may have to be less selective with respect to a material of the mask 108. However, further reducing selectivity of the presently used mask material (e.g. photoresist) may not be possible. Furthermore, an etching process designed to reduce the roughness of end 214 of the opening 110 may additionally be slower, which may require additional production capacity for opening etching (for example using a Bosch etching process).

The above described problems may be solved by forming a hard patterned mask within a substrate near a surface of a front side of the substrate 102.

FIG. 4A to FIG. 4D show a process flow for a method for forming an opening structure in accordance with various embodiments.

As shown in FIG. 4A, the method for manufacturing an opening structure 400 may, in various embodiments, include forming a patterned mask 424 over a first side 426 of a carrier 420.

The carrier 420 may for example include or consist of silicon or another semiconductor material. An etch selectivity (i.e. a ratio of an etching rate of a first material and of an etching rate of a second material) may for example be in the range from about 50 to about 2000, meaning that the etching rate of the carrier 420 material may be about 50 to about 2000 times as high as the etching rate of the mask 424 material.

In various embodiments, the carrier 420 may have a thickness b, wherein the thickness b may be a distance between the first side 427 of the carrier and the second side 426 of the carrier 420. The thickness b of the carrier 420 may be in a range from about 50 µm to about 600 µm, e.g. from about 300 µm to about 500 µm, e.g. about 300 µm or about 400 µm.

In various embodiments, the patterned mask 424 may have a first surface 423, wherein the first surface 423 of the patterned mask 424 may be facing towards the carrier 420, another surface (also referred to as second surface) 425 opposite the first surface 423, an inner rim 419 and an outer rim 421. The material of the patterned mask 424 may include or be any material that has a high etch selectivity with respect to the carrier 420 material. The patterned mask 424 may be a hard mask. The patterned mask 424 may for example be formed by forming the mask 424 as a continuous layer over the first side 426 of the carrier 420, and then structuring it photolithographically. The patterned mask 424 may have a thickness in the range from about 5 nm to about 1 µm, for example from about 300 nm to about 800 nm, for example from about 500 nm to about 700 nm. In various embodiments, the thickness of the patterned mask 424 may depend on a ratio of the etching rate of the material of the patterned mask 424 with respect to the etching rate of the carrier 420 material. If the etching rate of the carrier 420 is much higher than the etching rate of the patterned mask, for example 1000 times as high, the patterned mask 424 may have a thickness in the range from about 5 nm to about 50 nm. If the ratio of etching rates, i.e. the etch selectivity, is not as high, for example 100, i.e. the etching rate of the carrier 420 material is about 100 times as high as the etching rate of the patterned mask 424, the thickness of the patterned mask may be in the range from about 200 nm to about 1000 nm. In various embodiments, the thickness of the patterned mask may depend on subsequent processes, for example an initial thickness of the patterned mask 424, for example 850 nm, may be larger than a final thickness of the patterned mask 424 in order to account for chemical mechanical polishing/planarization (CMP) of the patterned mask 424. In various embodiments, subsequent processes may involve heating of the opening structure. Hence, the mask 424 material may be temperature resistant. In various embodiments, the mask 424 material may include or consist of at least one material from the following group of materials, the group including or consisting of an oxide, e.g. silicon dioxide, aluminum oxide or silicon oxynitride, a nitride, e.g. silicon nitride, carbon, a carbon compound, e.g. diamond like carbon, a carbide, e.g. silicon carbide, and high temperature resistant metals, e.g. tungsten.

In various embodiments, a first mask portion 424a and a second mask portion 424b of the mask 424 may join in front of and behind a plane shown in the cross section, such that they may form a closed structure, like a ring or a rectangular frame or a connected structure with one opening. In various other embodiments, the two portions of the mask 424a and 424b may be separated from each other. In various embodiments, an arbitrary number of mask portions which may be separated from each other may be provided.

In various embodiments, the method may further include forming material 422 over the first side 426 of the carrier 420 covering at least a portion of the carrier 420. The material 422 may further cover at least a portion of the patterned mask 424. A buried patterned mask 424 may thus be formed. In various embodiments, the material 422 may include or consist of a material with an etching rate that is substantially higher than that of the mask 424. The etching rate of the material 422 may for example be about 50 to about 2000 times as high as the etching rate of the mask 424. In various embodiments, the material 422 may be or include the same material as the carrier 420. The material 422 may for example be or include silicon, for example amorphous silicon, or for example polycrystal silicon (also referred to as polysilicon). In various embodiments, the material 422 may include some other material of a type similar to the material of the carrier 420, for example with respect to removal characteristics, e.g. etching characteristics during a plasma- or wet chemical etching, and/or electrical or mechanical properties. The material 422 may for example be another semiconductor material. In various embodiments, the material 422 may be doped. The doping may be performed in situ, i.e. during the forming of the material 422. In this way, subsequent high-temperature processes may be avoided, and a good electrical connectivity to the carrier 420 may be achieved.

In various embodiments, the material 422 may be formed in a single forming process. In various other embodiments, the material 422 may be formed in two or more individual forming processes, wherein other processes, such as etching or polishing, may be executed between the two or more individual forming processes.

In various embodiments, the material 422 may have a first thickness a, wherein the first thickness a may be a distance between a first surface of the material 422 facing the first side 426 of the carrier 420 and a second surface of the material 422 opposite the first surface of the material 422. The first thickness a of the material 422 may be in a range from about 500 nm to about 5 µm, for example from about 800 nm to about 1.2 µm, for example around 1.1 µm or for example around 2 µm.

In various embodiments, the material 422 may have a second thickness c above the patterned mask 424. The second thickness c may be a distance between the second surface 425 of the patterned mask 424 and the second surface of the material 422. In various embodiments, the second thickness c of the material 422 may be smaller than the first thickness a of the material 422. In various embodiments, the first thickness a and the second thickness c of the material may be the same. In various embodiments, the second thickness c of the material 422 may be below 3 μm, for example between 1 μm and 2 μm. In various embodiments, the second thickness c of the material 422 may be zero.

The material 422 may be formed over the first side 426 of the carrier 420 by means of deposition, for example by means of plasma deposition, chemical vapor deposition (CVD) or selective epitaxial growth (SEG).

In various embodiments, a surface of the material 422 opposite the carrier 420 may be smoothed, for example by means of chemical mechanical polishing/planarization.

As shown in FIG. 4B, in various embodiments, the method for manufacturing the opening structure 400 may further include forming a front side structure 429 over the material 422. In various embodiments, the front side structure 429 may include any kind of structure formed over the material 422 that requires an accurate positioning over a first side 426 of the carrier 420 (on the front side of the carrier 420) with respect to an opening to be formed from a second side 427 of the carrier 420 (from the back side). The front side structure 429 may for example include a microelectromechanical component or structure, a mechanical component or structure and/or an electronic component or structure. In various embodiments, the front side structure 429 may include or consist of two layers 428 and 430, or more than two layers. In various other embodiments, the front side structure 429 may only include or consist of one of the two layers 428 and 430. For example, the front side structure 429 may be formed as a single layer, or it may be formed by a plurality of layers, and some of the layers may be partially or completely removed later, for example after having served as protection or support.

The forming of the front side structure 429 may, in various embodiments, include forming a first layer 428 over the material 422. In various embodiments, the first layer 428 may be a continuous layer. Alternatively, the first layer 428 may be a discontinuous layer. The first layer 428 may for example be structured. In various embodiments, the first layer 428 may be a single layer. Alternatively, the first layer 428 may include or consist of a plurality of layers. In various embodiments, the first layer 428 may consist of or include a single material. Alternatively, the first layer 428 may consist of or include more than one material. The first layer 428 may for example include or consist of at least one material from a group of materials, the group including or consisting of an oxide, for example silicon dioxide, silicon oxynitride, and a glass, for example borophosphosilicate glass. The first layer 428 may have a thickness in a range from about 100 nm to about 1 μm, for example from about 300 nm to about 500 nm. The first layer 428 may for example be deposited, for example by means of plasma deposition or chemical vapor deposition (CVD).

As further shown in FIG. 4B, the method may include forming a second layer 430 over the first layer 428. In various embodiments, the second layer 430 may be a discontinuous layer. Alternatively, the second layer 430 may be a continuous layer. The second layer 430 may for example be structured. It may for example be a discontinuous or continuous structured layer. The second layer 430 may for example be deposited, for example by means of plasma deposition or chemical vapor deposition (CVD), for example thermal CVD. In various embodiments, the second layer 430 may be a single layer. Alternatively, the second layer 430 may include a plurality of layers. In various embodiments, the second layer 430 may consist of or include a single material. Alternatively, the second layer 430 may include more than one material. The second layer 430 may for example include or consist of at least one material from a group of materials, the group including or consisting of a semiconductor, for example silicon, for example polysilicon, and an oxide, for example silicon dioxide.

In various embodiments, at least one of the first layer 428 and the second layer 430 may be positioned precisely with respect to the patterned mask 424. In other words, in particular when the first layer 428 and/or the second layer 430 is structured and/or does not cover the surface on which it is formed, the first layer 428 and/or the second layer 430 may be arranged, within a plane of the respective layer 428 and/or 430, in such a way that the structures and/or circumference of the layer 428 and/or 430 are located in pre-defined relative positions with respect to the patterned mask 424.

Figure 4C:
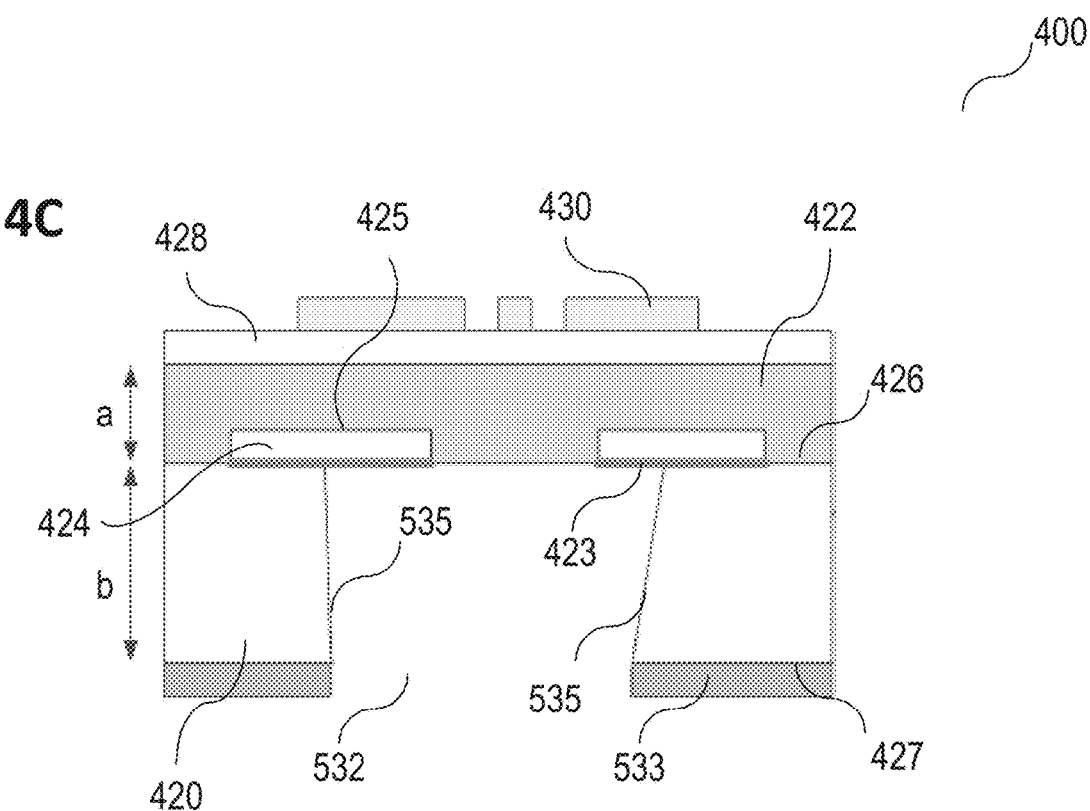

As shown in FIG. 4C, in various embodiments, the method may further include forming a first opening 532 in the carrier 420 from the second side 427 of the carrier 420 opposite the first side 426 of the carrier 420 to at least partially expose a surface 423 of the patterned mask 424.

In various embodiments, the first opening 532 may be a cavity. In various embodiments, the first opening 532 may be a trench. The first opening 532 may be etched, for example by means of plasma etching or/and wet chemical etching. A region to be etched may be defined by means of a second mask 533, for example a structured second mask 533. The second mask 533 may be formed on the second side 427 of the carrier 420. The second mask 533 may have a first side facing the second side 427 of the carrier 420, and a second side opposite the first side of the second mask 533.

The second mask 533 may include or consist of a material with a high etch selectivity with respect to the carrier 420. The patterned second mask 533 may for example be formed by forming the second mask 533 as a layer over the second side 427 of the carrier 420, and then structuring it photolithographically. In various embodiments, the second mask 424 material may include or consist of at least one material from the following group of materials, the group including or consisting of an oxide, e.g. silicon dioxide, aluminum oxide or silicon oxynitride, a nitride, e.g. silicon nitride, carbon, a carbon compound, e.g. diamond like carbon, a carbide, for example silicon carbide, and high temperature resistant metals, e.g. tungsten.

In various embodiments, the first opening 532 may extend from the second side of the second mask 533 through the second mask 533 and the carrier 420 to the first side 426 of the carrier 420. In this case, a depth of the first opening 532 may be a sum of the thickness b of the carrier 420 and the second mask 533. In other embodiments, for example after a removal of the second mask 533, the first opening 532 may extend from the second side 427 of the carrier 420 through the carrier 420 to the first side 426 of the carrier 420, i.e. a depth of the first opening 532 may be the thickness b of the carrier 420. The first opening 532 may also be described as extending between a first end of the first opening 532 near the first side 426 of the carrier 420 to a second end of the first opening 532 near the second side 427 of the carrier 420 (irrespective of whether the second mask 533 is still on the carrier 420 or not).

In various embodiments, the first opening 532 may be arranged on/in the carrier 420 in such a way that it at least partially exposes a surface 423 of the patterned mask 424. In other words, the first opening 532 may be arranged in the carrier 420 such that virtual planes coinciding with side walls 535 of the first opening 532 and extending beyond the side walls 535 towards the patterned mask 424 cut through the patterned mask 424. In various embodiments, said virtual planes may cut through the patterned mask 424 along an entire circumference formed by the side walls 535 of the first opening 532. Phrasing it in a yet different way, the forming of the first opening 532, for example the etching of the first opening 532, from the second side 427 of the carrier 420 may stop, at least near the circumference of the first opening 532, on the patterned mask 424. In various embodiments where the mask 424 is formed by the first mask portion 424a and the second mask portion 424b, or where the mask 424 may not form a closed circumference, but a circumference with one opening, said virtual planes may cut through the patterned mask 424 only in regions where the patterned mask 424 is present. In various embodiments, said virtual planes may not cut through the material 422 without cutting through the mask 424 first. By forming the first opening 532 according to any of the described embodiments, a surface 423 of the patterned mask 424 may be at least partially exposed. In various embodiments, a size of the first opening parallel to the first side 426 may not be larger than a size of the mask 424, i.e. a distance between opposing points on the outer rim 421 of the patterned mask 424.

In that case, the first opening 532 may be formed into the carrier 420 such that at least a portion of a first mask portion 424a of the patterned mask 424 and at least a portion of a second mask portion 424b of the patterned mask 424 are exposed by the first opening.

Figure 4D:
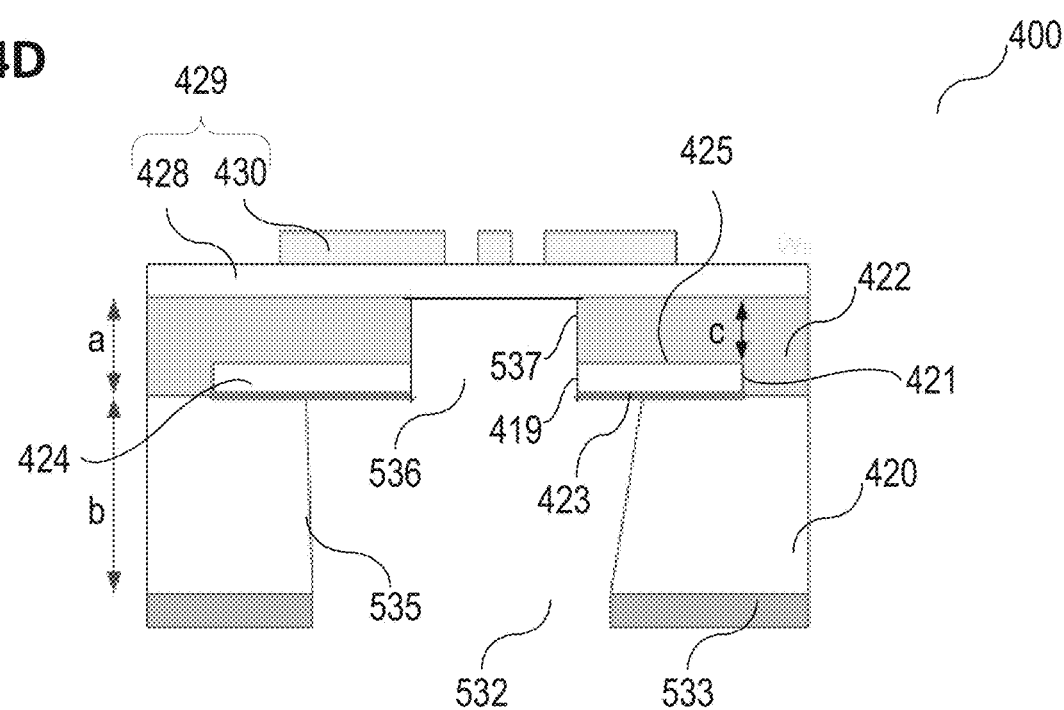

In various embodiments, as shown in FIG. 4D, the method may further include forming a second opening 536 in the material 422 from the second side 427 of the carrier 420, using the patterned mask 424 as a mask.

In various embodiments, the second opening 536 may be a cavity. In various embodiments, the second opening 536 may be a trench. For example, in various embodiments, the second opening 536 may extend from the first side 426 of the carrier 420 through the material 422 to the second surface of the material 422, i.e. a depth of the second opening 536 may be the thickness a of the material 422. In various embodiments, the first opening 532 may be formed with a larger width than the second opening 536, i.e. a distance between opposite points on an edge 535 of the carrier 520 along the first opening 532 may be larger than a distance between opposite points on an inner rim 537 of the material 422, measured in the same direction.

In various embodiments, the second opening 536 may be etched, for example by means of plasma etching, for example a Bosch etching process, or/and wet chemical etching. In various embodiments, the second opening 536 may for example be etched anisotropically, e.g. by means of a Bosch etching process. This may lead to the second opening 536 with an inner rim 537 of the material 422 that is flush with an inner rim 419 of the patterned mask 424, as shown in FIG. 4D. In various embodiments, alternatively or additionally, an isotropic etching may be executed, for example by means of wet chemical etching. This may lead to an inner rim 537 of the material 422 and/or 422b, as shown in FIG. 6A and FIG. 8A, that is etched beyond being flush with the inner rim 419 of the patterned mask 424. In other words, after the isotropic etching, the inner rim 537 of the material 422 may be located between the another surface 425 of the patterned mask 424 and the front side structure 429.

In various embodiments, the pattern of the patterned mask 424 may be formed in such a way that it can fulfill two functions: Firstly, the patterned mask 424 may serve as the patterned mask 424 for forming the second opening 536 in the material 422, for example the inner rim 419 of the patterned mask 424 may be located such that the second opening 536 may be formed in the material 422 from the first opening 532, for example by means of etching, and the second opening 536, with its structure and position defined by the patterned mask 424, may be positioned in the desired relative position with respect to the structure of the first layer 428 and/or the second layer 430. And secondly, the patterned mask may serve as a stop for the forming of the first opening 532, for example as an etch stop when the first opening 532 is formed by means of etching, for example by means of plasma etching, Bosch etching or wet-chemical etching. This means that the outer rim 421 of the patterned mask 424 may be positioned in such a way as to ensure that the line where the virtual planes along the side walls 535 of the first opening 532 cross the first side of the carrier 420 is located adjacent to (in FIG. 4D underneath) the patterned mask 424, and not adjacent to the material 422, even if the above described effects like tilting, shape change etc. occur during the forming of the first opening 532. In other words, a size of the patterned mask 424 orthogonal to its thickness may define a region in which the stop for the forming of the first opening 532, for example the etch stop, exists.

In various embodiments, the thickness a of the material 422 may be much smaller than the thickness b of the carrier 420, for example the ratio of the thickness of the carrier 420 and the material 422 may be above 10, for example above 100, for example about 200. In various embodiments, it may be possible to create an opening at the first layer 428 and/or the second layer 430 from the second side 427 of the carrier 420 without having to define the exact opening to be created in the second mask 533, which would cause large deviations from the desired shape of the opening at the first layer 428 and/or the second layer 430 because of the large depth of the first opening 532. Instead, the opening to be formed at the first layer 428 and/or the second layer 430 may be defined by the patterned mask 424, and the opening to be formed near the first layer 428 and/or the second layer 430 may be the second opening 536 with its relatively shallow depth. In this way, a large lateral displacement may be avoided, and the opening may be formed in almost exactly the desired position. If, for example, a tilting occurred during the forming of the second opening 536 with an angle that is the same as the angle with which the first opening 532 may be tilted, a factor by which the lateral displacement of the first opening 532 is larger than the lateral displacement of the second opening 536 may be the ratio of the thickness b of the carrier 420 and the thickness c of the material 422. If, for example, a lateral displacement of about 1 µm occurred in an opening structure during the forming of a first opening 532 in a carrier 420 with a thickness of about 400 µm because of a tilting of about 0.143°, a tilting with the same angle occurring during the forming of a second opening in a material 422 of the opening structure, wherein the material may have a thickness of about 2 µm, would lead to a lateral displacement of only about 50 nm. This means that, by using the patterned mask 424, which may be located near the second surface of the material 422, compared with the second mask 533, as the mask for forming the second opening 536, a relative positioning of the structures of the first layer 428 and/or the second layer 430 with respect to the second opening 536 may be achieved with a very high precision.

With the patterned mask 424 having been formed over the first side 426 of the carrier 420, the inner rim 419 of the patterned mask 424 may represent a smooth edge that may serve as a patterned mask 424 for forming a smooth inner rim 537 on the second part 422b of the material 422 in the second opening 536, even though the edge 535 of the carrier 420 along the first opening 532 may be a rough edge.

As another way to describe the method, the patterned mask 424 and the second mask 533 may be considered as forming a kind of "focusing system", which allows for forming an upper edge of the second opening 536 at a desired position with high precision, while at the same time allowing for rather loose tolerances on the position and/or shape of the first opening 532 and of the second mask 533, respectively.

In various embodiments, the method may thus include forming the patterned mask 424 over the first side 426 of the carrier 420, forming the material 422 over the first side 426 of the carrier 420 covering at least a portion of the carrier 420, forming the second mask 533 over the second side 427 of the carrier 420 opposite the first side 426 of the carrier 420, and forming an opening 532, 536 in the carrier 420 and in the material 422 from the second side 427 of the carrier 420 using the second mask 533 and the patterned mask 424 as masks. A positioning tolerance and/or a shape tolerance on the second mask 533 may be looser than on the patterned mask 424.

FIG. 5A to FIG. 5H show a process flow for a method for forming an opening structure 600 in accordance with various embodiments. Unless specifically excluded, materials, thicknesses and sizes of structures, techniques of forming a layer, an opening or a structure and other parameters may be the same as described in context with corresponding features in FIG. 4A to FIG. 4D.

As shown in FIG. 5A, the method for forming an opening structure 600 in accordance with various embodiments may include forming a patterned mask 424 over a first side 426 of a carrier 420. This may include depositing a mask material, for example an oxide, for example tetraethyl orthosilicate (TEOS) over the first side 426 of the carrier 420.

In various embodiments, the material used for forming the patterned mask 424 may additionally be used for forming an alignment mark 644 over the first side of the carrier 420. In various other embodiments, the alignment mark 644 may be formed over the first side 426 of the carrier 420 before or after the forming of the patterned mask 424, for example using a different material.

In various embodiments, a thickness of the material of the patterned mask 424 deposited over the first side 426 of the carrier 420 may be chosen such that a desired thickness of the patterned mask 424 may remain even after CMP is applied to the patterned mask 424. The thickness may for example be around 850 nm.

In various embodiments, the TEOS may be densified.

In various embodiments, the material of the patterned mask 424 formed over the first side of the carrier 420 may be patterned, for example by photolithographical patterning, i.e. a pattern defined by a photoresist may be formed in the material of the patterned mask 424. Forming the pattern in the material of the patterned mask 424 may for example be performed by means of etching, e.g. plasma etching. There-after, the photoresist may be removed, for example by means of photochemical etching, plasma etching, plasma ashing, and/or wet chemical etching.

In various embodiments, as shown in FIG. 5B, the method may further include forming material 422 over the first side 426 of the carrier 420 covering at least a portion of the carrier 420. The material 422 may for example be formed by means of deposition. The material 422 may for example be polysilicon, or for example amorphous silicon. The material 422 may be doped in situ.

In various embodiments, the material used for forming the material 422, e.g. the polysilicon, may also be used for forming a second backside layer 648 over the first backside layer 640.

In various embodiments, a thickness of the material 422 may be such that the patterned mask and the material, and possibly also the alignment mark, may form one common surface after CMP from the side of the material 422 over the first side 426 of the carrier 420 down to the mask 424. The thickness of the material may at least be the desired thickness of the mask 424 after CMP, for example the same as the thickness with which the patterned mask 424 is formed, or it may be thicker.

In various embodiments, the material 422 may be formed also over the patterned mask 424, and/or over the alignment mask 644. In various embodiments, the material 422 may be formed only over/on the carrier 420, and not over the patterned mask 424 or the alignment mark 644.

As shown in FIG. 5C, the method may further include chemical-mechanical polishing/planarization from the side of the material 422 over the first side 426 of the carrier 420 down to the patterned mask 424 until another surface 425 of the patterned mask 424 (and, if present, a corresponding surface of the alignment mark 644) is/are exposed and/or a desired level of polishing/planarization and/or a desired thickness of the mask 424, and/or a pre-defined duration of CMP is reached. The patterned mask 424 may have been formed thick enough to allow for a thinning by means of this CMP.

In various embodiments, as shown in FIG. 5D, the method may further include forming an alignment mark etching mask 650 over the patterned mask 424 and/or over the material 422. The alignment mark etching mask 650 may for example be formed from photoresist. The alignment mark 644 may be removed, for example by means of wet chemical oxide etching.

In various other embodiments, for example if the alignment mark 644 is formed from a material different from the material of the patterned mask 424, for example if said material has a different removal characteristics, e.g. etching characteristics, from both the material 422 and the material of the patterned mask 424, the alignment mark 644 may be removed, e.g. etched, without forming the alignment mark etching mask 650.

Figure 5E:
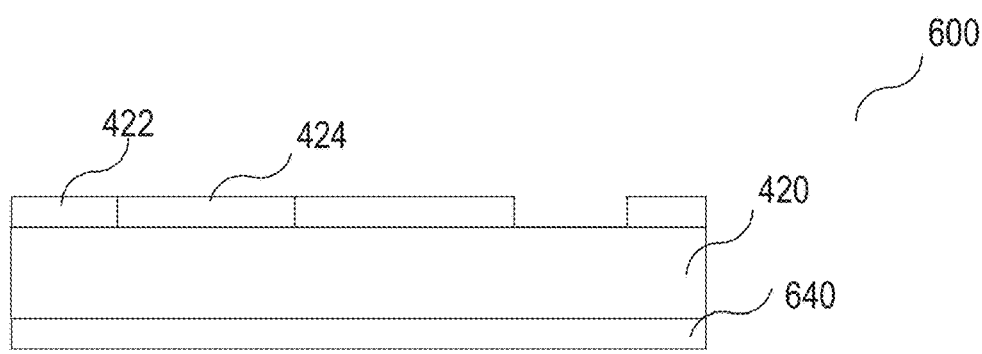
Figure 5F:
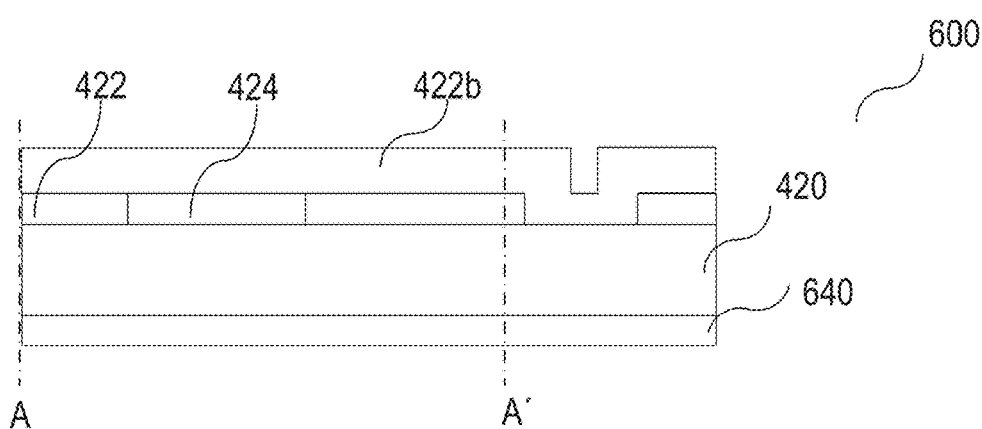

In various embodiments, as shown in FIG. 5F, the method may further include forming a second part 422b of the material 422 over the material 422, and possibly also above the patterned mask 424 and/or the carrier 420, in a region where the alignment mark 644 was removed. The material of the second part 422b of the material 422 may be the same as the material 422, or it may be a different material, for example a material with similar properties as the material 422, for example with similar physical, chemical, mechanical and/or electrical properties, for example with a similar coefficient of thermal expansion and/or with similar removal characteristics, e.g. etching characteristics. The material of the second part 422b of the material 422 may for example be doped in situ. In this way, an intrinsic stress (which might bow the carrier 420) after a later heating may be avoided, and a good electrical connectivity to the carrier 420 may be provided. The forming of the second part 422b of the material 422 may include deposition, for example deposition of polysilicon or of amorphous silicon. The second part 422b of the material 422 (or, more generally, over the material 422) may have any thickness that is required by a front side structure 761 (see FIG. 5H) to be formed over the second part 422b of the material 422 (or, more generally, over the material 422). In various embodiments, a rigid body may be provided by a thick material 422 (and, if present, 422b). In various embodiments, the front side structure 761 may require a pre-defined depth of an opening (for example corresponding to the second opening in FIG. 4D, or a combination of the first opening 532 and the second opening 536 in FIG. 4D). For example, the second part 422b of the material 422 may have a thickness in a range from about 500 nm to about 3 µm, for example from about 1 µm to about 1.5 µm, for example around 1.4 µm. In various embodiments, in which the second part 422b of the material 422 is also formed in the region where the alignment mark 644 was removed, a width x of the alignment mark 644 (see FIG. 5A) and the thickness of the second part 422b of the material 422 may be selected in such a way that the region where the alignment mark 644 was removed does not get completely filled in by the second part 422b of the material 422. In other words, the width of the alignment mark 644 may be determined to be large enough and/or the thickness of the second part 422b of the material 422 may be selected to be thin enough such that a position where the alignment mark 644 had been placed can be identified even after the forming of the second part 422b of the material 422, e.g. by means of a cavity remaining at or above the position where the alignment mark 644 had been placed.

In various embodiments, for example if the material 422 and/or the second part 422b of the material 422 are formed from polysilicon or from amorphous silicon, the material 422 and/or the second part 422b of the material 422 may be crystallized, for example by means of thermal annealing (heating).

Figure 5G:
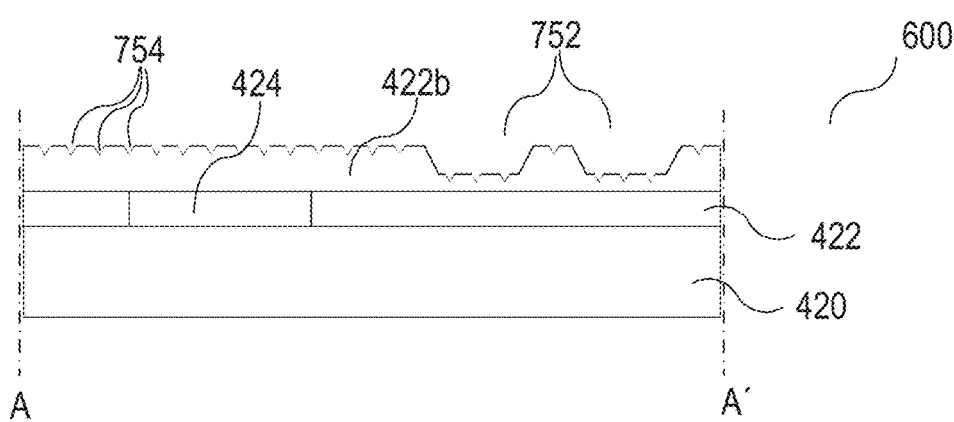
Figure 5H:
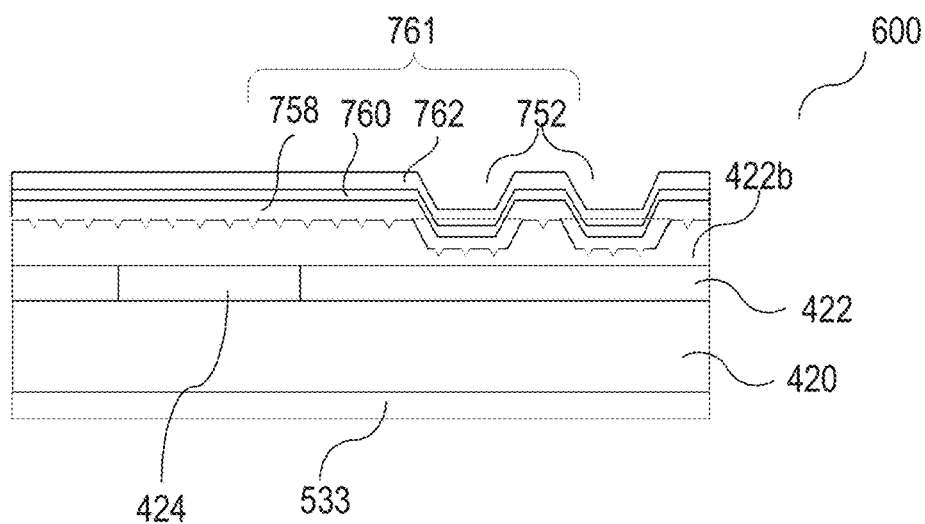

A front side structure 761 (as shown in FIG. 5H and FIG. 6A, and corresponding to the front side structure 429 in FIG. 4D) may for example include or consist of a microphone or a loudspeaker, a membrane 762 for a microphone or for a loudspeaker, or a membrane 762 with a holding structure 758, 760. In various embodiments, the membrane 762 may essentially be a plane membrane. In various other embodiments, the membrane 762 may include a corrugation 752. In various embodiments, as shown in FIG. 5G, which shows a region indicated by vertical lines labelled A and A' in FIG. 5F after further processing, the corrugation 752 may be formed in the second part 422b of the material 422, thereby providing a form or a mold for the corrugation 752 to be formed in the membrane 762. A positioning of the corrugation 752. in a plane of the material in which it is formed, i.e. in the second part 422b of the material 422 or the material 422, may be accurately adjusted by means of the alignment mark 644 or by the cavity remaining at or above the position where the alignment mark 644 had been placed. In various embodiments, for example if no dedicated alignment mark is required, for example because the patterned mask 424 may be used for ensuring the accurate positioning of the corrugation 752, or generally of the front side structure 429 (as in FIG. 4D), the corrugation 752 may be formed in the material 422, or more generally, the front side structure 429 may be formed above or in the material 422.

In various embodiments, the forming of the corrugation 752 may include a local oxidization of silicon, i.e. of the second part 422b of the material 422 or of the material 422, an etching of the corrugation 752, and a removal of the oxide (not shown).

In various embodiments, as shown in FIG. 5H, the forming of the front side structure 761 may further include forming of a first layer 758 over the second part 422b of the material 422, of an intermediate layer 760 over the first layer 758, and of a second layer 762 (also referred to as the membrane 762) over the intermediate layer 760.

In various embodiments, the forming of the first layer 758 may for example include forming an oxide layer, for example by means of rapid thermal oxidization. In various embodiments, the first layer 758 may serve as a diffusion barrier for the intermediate layer to prevent or alleviate out-diffusion from the intermediate layer, for example if the intermediate layer 760 is formed from borophosphosilicate glass. The first layer 758 may have a thickness in a range from about 1 nm to about 1 µm, for example from about 100 nm to about 500 nm.

In various embodiments, the forming of the intermediate layer 760 may for example include forming a borophosphosilicate glass layer, for example by means of deposition. In various embodiments, the intermediate layer 760 may be made flow, for example by means of heating above a flowing point. The intermediate layer 760 may be formed as thin as possible while providing sufficient stability. For example, the intermediate layer may have a thickness in a range from about 100 nm to about 300 nm, for example about 150 nm.

In various embodiments, the forming of the second layer 762 may include forming an oxide layer, for example by means of deposition, for example by means of TEOS deposition or by means of plasma deposition. In this various embodiments, the second layer 762 may have a thickness in a range from about 50 nm to about 1 µm, for example from about 300 to about 700 nm, for example about 330 nm or about 660 nm.

In various embodiments, the method may include various further processing, e.g. forming of a first opening 532 and a second opening 536 as described in connection with FIG. 4C and FIG. 4D, and with FIG. 6A and FIG. 6B.

FIG. 6A and FIG. 6B show cross sections of an opening structure 600 according to various embodiments, and at different stages during a manufacturing process.

In various embodiments, the opening structure 600 may include a carrier 420 including a first side 426 and a second side 427 opposite the first side 426; a patterned mask 424 formed over the first side 426 of the carrier 420; a first opening 532 formed in the carrier 420, wherein the first opening 532 extends between the first side 426 of the carrier 420 and the second side 427 of the carrier 420, and wherein the first opening 532 is at least partially covered at a first end of the first opening 532 by the patterned mask 424; a material 422, formed over at least a part of the carrier 420 on the first side 426 of the carrier 420; and a second opening 536 formed in the material 422 in fluid communication with the first opening 532.

The opening structure 600 may have been formed by employing a method according to various embodiments described in connection with FIG. 4A to FIG. 4D, FIG. 5A to FIG. 5H or FIG. 7A to FIG. 7E. In various embodiments, the opening structure may include features described in context with said methods of its manufacturing, and vice versa.

In various embodiments, the opening structure 600 may have undergone further processing, at least some of which will be described in the following.

In various embodiments, the opening structure 600 may further include a second part 422b of the material 422, which may be formed at least partially over the material 422. The second part 422b of the material 422 may additionally be formed at least partially over the patterned mask 424. In various embodiments, the second part 422b of the material 422 may be formed together with the material 422. In this case, the material 422 and the second part 422b of the material 422 may together be considered as forming the material 422.

In various embodiments, the opening structure 600 may further include a front side structure 761 formed at least partially over the second part 422b of the material 422, and/or over the material 422. The front side structure 761 may additionally be formed at least partially over the patterned mask 424. In various embodiments, the front side structure 761 may include a first layer 758. The front side structure 761 may include an intermediate layer 760 and/or a second layer 762.

In various embodiments, the accurately shaped and positioned patterned mask 424 may have an inner rim 419 that may represent a smooth edge. The patterned mask 424 with its inner rim 419 may serve as a mask for forming a smooth inner rim 537 on the second part 422b of the material 422 in the second opening 536, even though the edge 535 of the carrier 420 may be a rough edge.

In various embodiments, in the opening structure 600, the second part 422b of the material 422 may not be electrically floating, it may rather be in electrical contact with the carrier 420 and therefore have an electrical potential of the carrier 420. Consequently, additional processes, e.g. photolithographical processes, for electrically contacting the second part 422b of the material 422 may not be required.

In various embodiments, the second part 422b of the material 422 may be as thick as desired, e.g. as thick as required by an intended application. Nevertheless, this may be accomplished without introducing additional topology.

In various embodiments, the second part 422b of the material 422 may be cut/sawed jointly with the carrier 420. By way of example, the carrier 420 may be cut together with the material 422 and/or with the second part 422b of the material 422. Cutting of the opening structure 600 may for example be performed by means of laser cutting/sawing. The opening structure 600 may be suitable for laser cutting, because the material 422 and the second part 422b of the material 422 may be similar to the material of the carrier 420 or may be the same material as the material of the carrier 420. The cutting may be performed vertically to the first side 426 and/or the second side 427 of the carrier 420. The cutting may for example be performed in a region where the opening structure 600 may be cut vertically to the first side 426 and/or the second side 427 of the carrier 420 without cutting through the patterned hard mask 424 and/or through the front side structure 761 and/or through the first opening 532 and/or through the second opening 536.

Chemical-mechanical polishing may be performed before forming the front side structure 761. The front side structure 761, for example a microelectromechanical system, for example a membrane with or without a corrugation, may be formed in the opening structure 600 without having to account for a later chemical-mechanical polishing.

As shown in FIG. 6B, in various embodiments, the opening structure 600 may further include a third opening 872. The third opening 872 may be formed from a direction of the second opening 536, and it may be in fluid communication with the second opening 536. The second part 422b of the material 422 may serve as a patterned mask for forming the third opening 872. An inner rim 537 of the second part 422b of the material 422 may be smooth. It may have been smoothly formed when the second opening 536 was formed using the patterned mask 424 as a mask. The second part 422b of the material 422 may have been patterned with an accurate shape and positioning with respect to the front side structure 761. It may serve for forming a smooth, accurately aligned and shaped edge In various embodiments, forming of the third opening 872 may for example be performed by means of etching, for example by means of plasma etching or wet-chemical etching, for example by means of etching using hydrogen fluoride or hydrofluoric acid.

In various embodiments, the first layer 758 and the patterned mask 424 may be reduced in volume, e.g. etched, during the forming of the third opening 872. The intermediate layer 760 may also be reduced in volume, e.g. etched, during the forming of the third opening 872. Thereby, a new inner rim 876 may be formed on the patterned mask 424, the first layer 758 may newly form an inner rim 874, and the intermediate layer 760 may newly form an inner rim 878. In various embodiments, a positioning of the inner rim 874 of the first layer 758 and of the inner rim 878 of the intermediate layer 760 may depend on the front side structure 761, and its intended functionality and positioning. But generally, the inner rims 874 and/or 878 should not recede so far that the front side structure 761 or essential parts of the front side structure 761 become detached from the opening structure 600. In other words, the third cavity 872 should at least be formed small enough such that the front side structure 761, or at least those parts that are essential to the functionality of the opening structure 600, may remain physically connected to the opening structure 600. For example, the second layer 762 of the front side structure 761 may form a membrane 762 that is supported near its edge by parts of the first layer 758 and/or the intermediate layer 760 that remain outside their respective inner rims 874 and/or 878, forming a supporting structure. In various embodiments, the front side structure 761 may include structures that may have to be cleared in order to ensure functionality of the front side structure 761. In case of the membrane 762, such structures may for example include a vent hole 868 or the corrugation 752. In that case, the third cavity 872 may be formed in such a way, e.g. large enough and with the inner rims 874 and/or 878 receding far enough from a center of the third cavity 872, to ensure that said structures are freed from material that hinders their proper functioning. In various embodiments as shown in FIG. 6A, this may mean that the first layer 758 and the second layer 760 are removed completely underneath the corrugation 752 and underneath the vent hole 868.

In various embodiments, within their inner rims 874 and/or 878, the first layer 758 and/or the intermediate layer 760, respectively, may form the third cavity 872. The third cavity 872, the second cavity 536 and the first cavity 532 may be in fluid communication. They may form one joint more or less free room underneath at least a part of the front side structure 761, i.e. on a side of the front side structure 761 that may be facing towards the carrier 420 In various embodiments, for example if the front side structure 761 includes the membrane 762, the third cavity 872, the combination of third cavity 872 and second cavity 536, or the combination of third 872, second 536 and first 532 cavity may provide free space that may make a movement of the membrane 762 into and out of the cavity or cavities possible. In various embodiments, this free space may similarly be provided to front side structures 761 that may require space for motion, a resonance volume, an evacuated or fluid-filled volume, or the like.

In various embodiments, a distance between an inner rim 537 of the second part 422b of the material 422 and an inner rim 874 of the first layer 758, a thickness of the first layer 758, a thickness of the intermediate layer 760, a size/diameter of the inner rim 874 of the first layer 758 and parameters relevant for the movement of a moveable part of the front side structure 761 may be chosen such that a protruding part of the second part 422b of the material 422, which may protrude into the second opening 536, may not hinder the movement of the moveable part of the front side structure 761 and/or damage it.

FIG. 7A to FIG. 7E show a process flow for a method for forming an opening structure in accordance with various embodiments. Unless specifically excluded, materials, thicknesses and sizes of structures, techniques of forming a layer, an opening or a structure and other parameters may be the same as described in context with corresponding features in FIG. 4A to FIG. 4D, FIG. 5A to 5H or FIG. 6A or FIG. 6B.

Figure 7A:
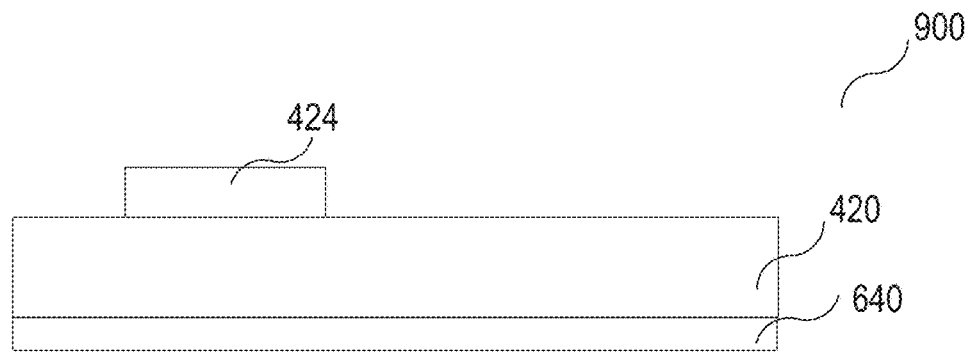
FIG. 7A to FIG. 7E show a process flow for a method for forming an opening structure in accordance with various embodiments.

As shown in FIG. 7A, the method for forming an opening structure in accordance with various embodiments may include forming a patterned mask 424 over a first side 426 of a carrier 420. This may include depositing a mask material, for example an oxide, for example tetraethyl orthosilicate (TEOS) or a thermal oxide, over the first side 426 of the carrier 420.

In various embodiments, a thickness of the material of the patterned mask 424 deposited over the first side 426 of the carrier 420 may for example be 650 nm.

In various embodiments, the TEOS may be densified.

In various embodiments, the material of the patterned mask 424 formed over the first side of the carrier 420 may be patterned, for example by photolithographical patterning, i.e. a pattern defined by a photoresist may be formed in the material of the patterned mask 424. Forming the pattern in the material of the patterned mask 424 may for example be performed by means of etching, e.g. plasma etching, which may leave the first backside layer 640 intact. Thereafter, the photoresist may be removed, for example by means of photochemical etching, plasma etching, plasma ashing and/or wet chemical etching.

Figure 7B:
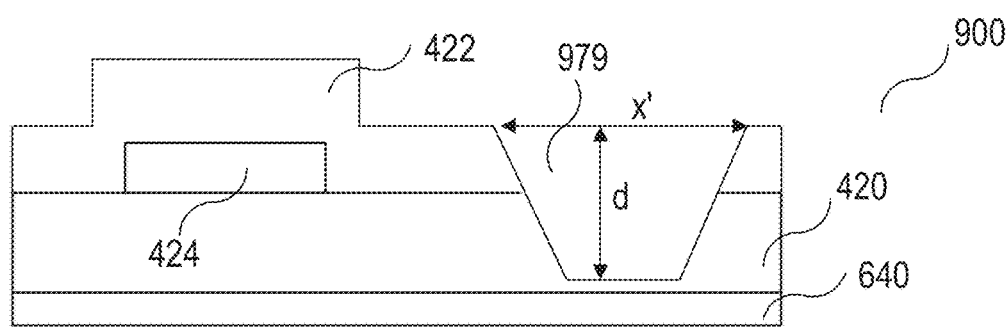

In various embodiments, as shown in FIG. 7B, the method may further include forming material 422 over the first side 426 of the carrier 420 covering at least a portion of the carrier 420, and over the patterned mask 424. The material 422 may for example be formed by means of deposition or SEG. The material 422 may for example be silicon, for example polysilicon, or amorphous silicon. The material 422 may be doped in situ, such that a heating of the opening structure may not create stress within the material 422, and for providing a good electrical contact to the carrier 420.

In various embodiments, a thickness of the material 422 may be such that the material 422 may undergo CMP from the side of the material 422 over the first side 426 of the carrier 420, but leave at least a thin layer of the material 422 over the patterned mask 424. In other words, the thickness of the material 422 may at least be the sum of the thickness of the patterned mask 424 and the thickness of the thin layer of the material 422. The thickness of the material 422 may for example be 1100 nm.

In various embodiments, an alignment mark 979 may be formed in the material 422 and in the carrier 420 from the material 422 above the first side 426 of the carrier 420. The alignment mark 979 may be an opening, for example a cavity or a trench. The alignment mark 979 may be formed by means of etching, for example by means of plasma etching, for example by means of isotropic etching. The etching may be performed photolithographically, for example by using a photo mask (not shown).

A depth d and a width x' of the alignment mark 979 may depend on the thickness of the material 422b. A thick material 422b may fill the alignment mark 979, such that it may not be recognized as alignment mark. Thus, the depth d and the width x' of the alignment mark 979 may be selected such that the alignment mark 979 may not get filled in by the material 422b with the intended thickness. In various embodiments, the width of the structure in the photo mask that will be used for forming the alignment mark 979 may correlate with the thickness of the material 422b, i.e. if the material 422b is thicker, the alignment mark 979 may be formed wider and/or deeper, and if the material 422b is thinner, the alignment mark 979 may be formed narrower and/or shallower. In various embodiments, the alignment mark 979 may have a depth of about 600 nm and a width of about 4 μnm. In other embodiments, the alignment mark may have any combination of keeping that depth or width, making the alignment mark 979 deeper or shallower, and making it narrower or wider.

In various embodiments, the photo mask may be removed.

Figure 7C:
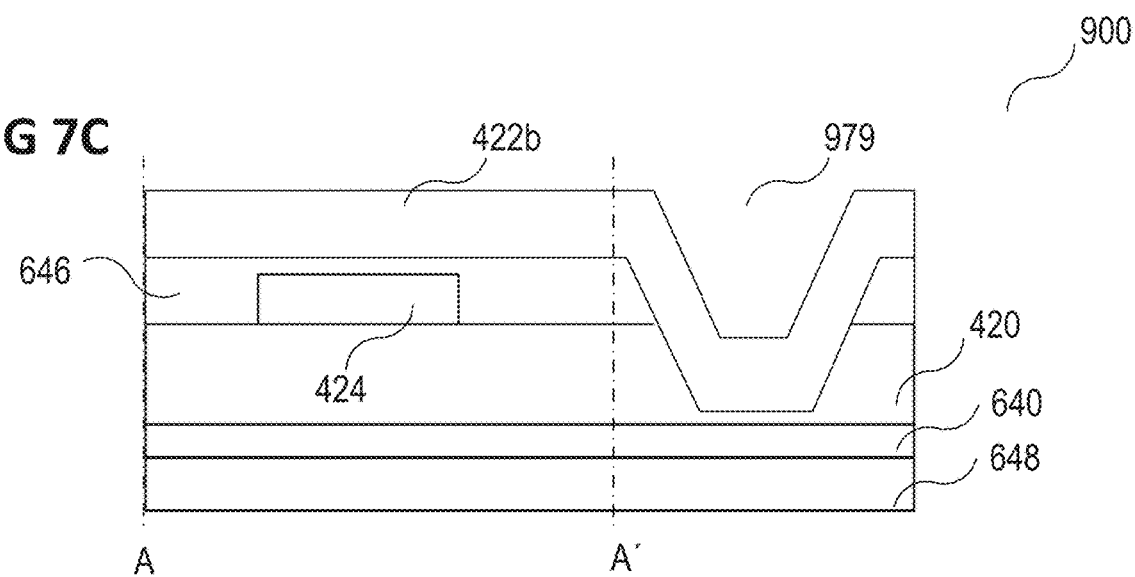

As shown in FIG. 7C, in various embodiments, the opening structure 900 may be polished from the side of the material 422, for example by means of CMP. A smooth, plane surface of the material 422 may be formed, for example over the patterned mask 424 and over the material 422. A thickness of the material 422 over the carrier 420 after polishing may be larger than the thickness of the patterned mask 424, for example the thickness of the material 422 over the carrier 420 may be about 900 nm.

In various embodiments, as shown in FIG. 7C, the method may further include forming a second part 422b of the material 422 over the material 422, and over the carrier 420 in a region where the alignment mark 979 was formed, possibly also above the patterned mask 424. The material of the second part 422b of the material 422 may be the same as the material 422, or it may be a different material, for example a material with similar properties as the material 422, for example with similar physical, chemical, mechanical and/or electrical properties, for example with a similar coefficient of thermal expansion and/or with similar removal characteristics, e.g. etching characteristics. The material of the second part 422b of the material 422 may for example be doped in situ. In this way, an intrinsic stress (which might bow the carrier 420) after a later heating may be avoided, and a good electrical connectivity to the carrier 420 may be provided. The forming of the second part 422b of the material 422 may include deposition, for example deposition of silicon, for example of polysilicon or of amorphous silicon. The second part 422b of the material 422 (or, more generally, over the material 422) may have any thickness that is required by a front side structure 761 (see FIG. 5H) to be formed over the second part 422b of the material 422 (or, more generally, over the material 422). In particular, in various embodiments a rigid body may be provided by a thick material 422 (and, if present, 422b). This may act like a thick carrier 420.

In various embodiments, a breaking of the front side structure 429 on a rough edge of a carrier around a cavity, like it may happen in an opening structure of the prior art if it suffers an impact, may be avoided.

In various embodiments, the front side structure 761 may require a pre-defined depth of an opening (for example corresponding to the second opening in FIG. 4D, or a combination of the first opening 532 and the second opening 536 in FIG. 4D). By way of example, the second part 422*b* of the material 422 may have a thickness in a range from about 500 nm to about 3 µm, for example from about 1 µm to about 1.5 µm, for example around 1.4 µm. In various embodiments, in which the second part 422*b* of the material 422 is also formed in the region where the alignment mark 979 was formed, a width x' of the alignment mark 979 (see FIG. 7B) and the thickness of the polished/planarized material 422 and of the second part 422*b* of the material 422 may be selected in such a way that the region where the alignment mark 979 was formed does not get completely filled in by the second part 422*b* of the material 422. In other words, the width of the alignment mark 979 may be determined to be large enough and/or the thickness of the second part 422*b* of the material 422 may be selected to be thin enough such that a position where the alignment mark 979 is located can be identified even after the forming of the second part 422*b* of the material 422, e.g. by means of a cavity remaining at or above the position where the alignment mark 979 was formed.

In various embodiments, for example if the material 422 and/or the second part 422*b* of the material 422 are formed from polysilicon or from amorphous silicon, the material 422 and/or the second part 422*b* of the material 422 may be crystallized, for example by means of thermal annealing (heating).

In various embodiments, a corrugation 752, or rather a form or a mold for the corrugation 752 to be formed in the membrane 762, may be formed according to processes described in the context of FIG. 5G, and with the same reasoning, materials, parameters, results etc. As an alignment mark, the alignment mark 979, or the cavity remaining at or above the position where the alignment mark 979 had been, may be used.

Figure 7D:
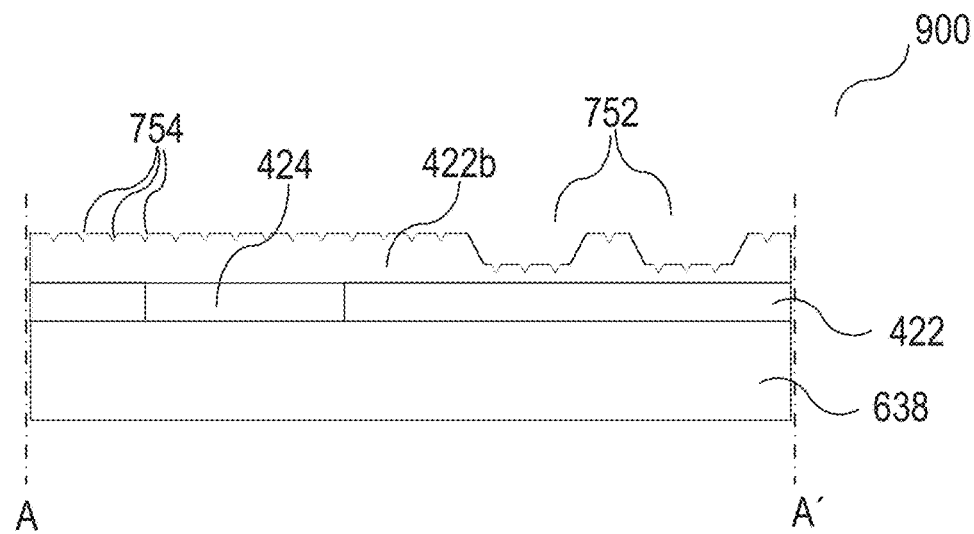
Figure 7E:
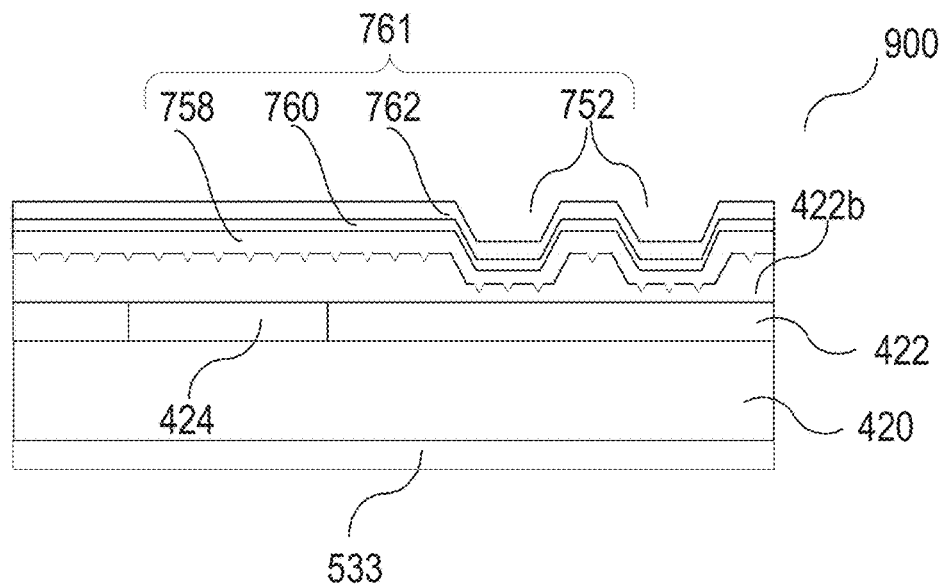

As shown in FIG. 7E, the method for forming the opening structure 900 may, in various embodiments, further include forming a front side structure 761.

In various embodiments, the front side structure 761 may be formed in the same way and with the same processes, parameters, materials etc. as described in the context of FIG. 5H.

In various embodiments, the method may include various further processing, e.g. forming of a first opening 532 and a second opening 536 as described in connection with FIG. 4C and FIG. 4D, FIG. 6A and FIG. 6B, and FIG. 8A and FIG. 8B.

FIG. 8A and FIG. 8B show cross sections of an opening structure 900 according to various embodiments, and at different stages during a manufacturing process. The opening structure 900 may have been formed by employing a method according to various embodiments described in connection with FIG. 4A to FIG. 4D, FIG. 5A to FIG. 5H, FIG. 7A to FIG. 7E, FIG. 8A and/or FIG. 8B. In various embodiments, the opening structure 900 may include features described in context with said methods of its manufacturing, and vice versa.

In various embodiments, the opening structure 900 may have undergone further processing after the stage shown in FIG. 7E, at least some of which may correspond to those described in context with processing applied to the opening structure 600, for example in context with FIG. 6A and FIG. 6B.

In various embodiments, the opening structures 600 of FIG. 6A and FIG. 6B may differ from the opening structures 900 of FIG. 8A and FIG. 8B by a thin layer of material 422 formed over the patterned mask 424 which may be present in the opening structure 900, and not be present in the opening structure 600. In various embodiments, where the material 422 and the second part of the material 422*b* may be the same material, this difference may not be noticeable in the opening structures 600 and 900, respectively, but may only be noticed in the method for manufacturing the opening structures 600 and 900, respectively. Additionally, the opening structures 600 and 900 may differ by the alignment marks 644 and 979, respectively, which are not shown in FIG. 6A, FIG. 6B, FIG. 8A and FIG. 8B.

Figure 9:
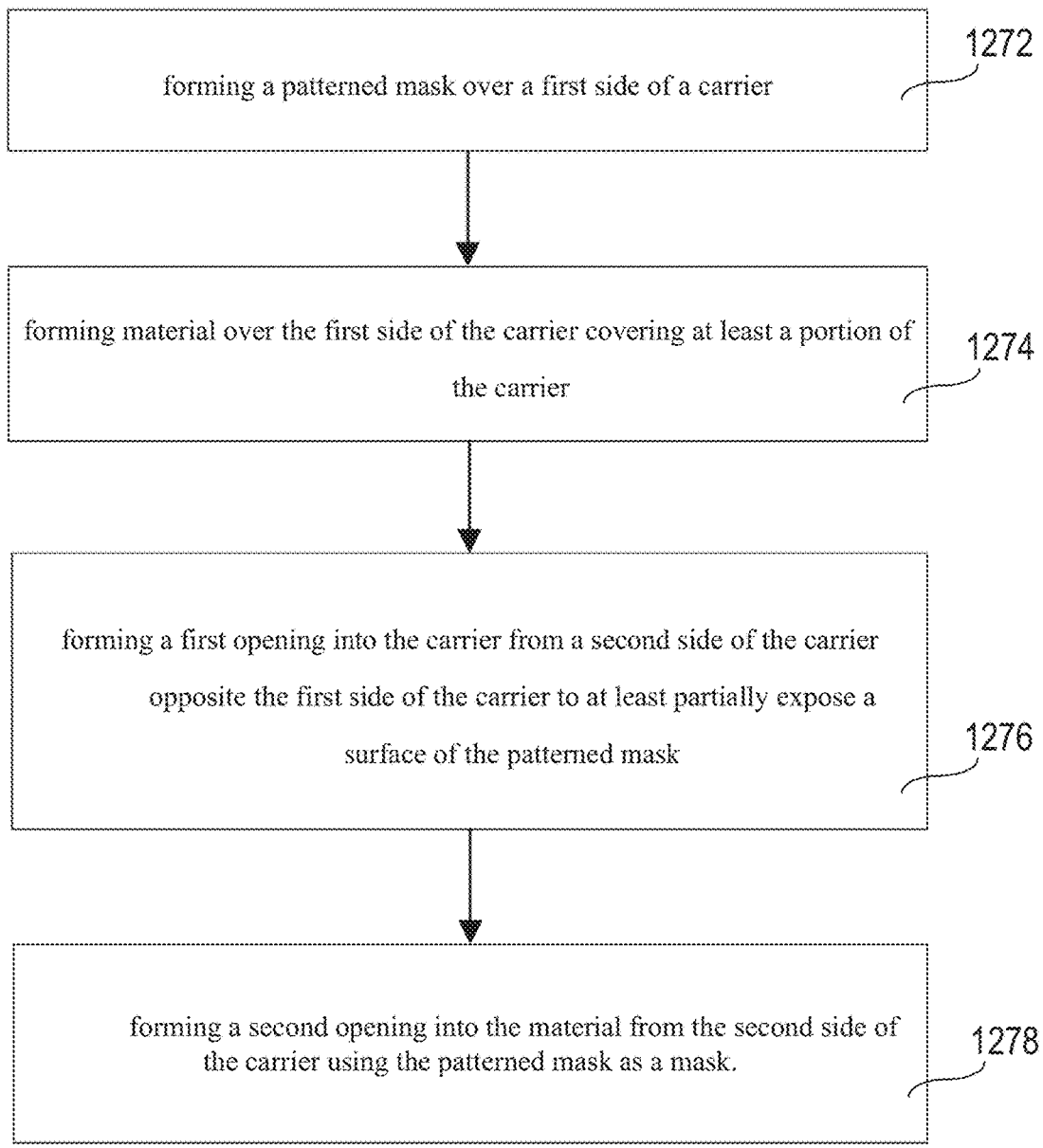
FIG. 9 shows a schematic diagram of a method for forming an opening structure in accordance with various embodiments.

FIG. 9 shows a schematic diagram of a method for forming an opening structure in accordance with various embodiments.

In various embodiments, the method may include, in 1272, forming a patterned mask over a first side of a carrier. It may further include, in 1274, forming material over the first side of the carrier covering at least a portion of the carrier. The method may further include, in 1276, forming a first opening into the carrier from a second side of the carrier opposite the first side of the carrier to at least partially expose a surface of the patterned mask. It may further include, in 1278, forming a second opening into the material from the second side of the carrier using the patterned mask as a mask.

In various embodiments, the method may include further processing, for example according to various embodiments described in context with FIG. 4A to FIG. 4D, FIG. 5A to FIG. 5H, FIG. 6A, FIG. 6B, FIG. 7A to FIG. 7E, FIG. 8A and FIG. 8B.

FIG. 10A to FIG. 10D show a process flow for a method for forming an opening structure 1300 and an opening structure 1300 in accordance with various embodiments.

Figure 10A:
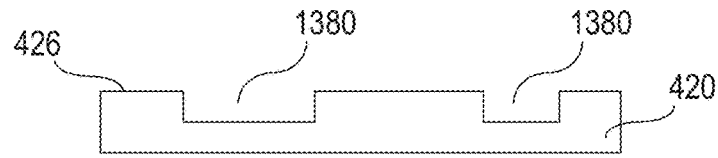
FIG. 10A to FIG. 10D show a process flow for a method for forming an opening structure in accordance with various embodiments.

In various embodiments, as shown in FIG. 10A, the method may include forming at least one opening 1380 in a carrier 420 from a first side 426 of the carrier. The carrier 420 may have the same properties as the carrier 420 of any of the previously described embodiments. In various embodiments, the at least one opening 1380 may be formed by means of etching, for example by means of plasma etching.

In various embodiments, a depth of the at least one opening 1380 may be approximately the same as a height of a structured mask 424 to be formed, wherein the structured mask 424 to be formed may be similar to the structured mask 424 of the previously described embodiments, with the exception that the structured mask 424 in accordance with various presently described embodiments may be formed within the carrier 420, while the structured mask 424 of the previous embodiments was formed on the carrier 420.

In various embodiments, a number, location and shape of the at least one opening 1380 may correspond to a shape of the structured mask 424 to be formed. In various embodiments, the structured mask 424 to be formed, and hence the opening 1380, may be shaped like an annulus.

Figure 10B:
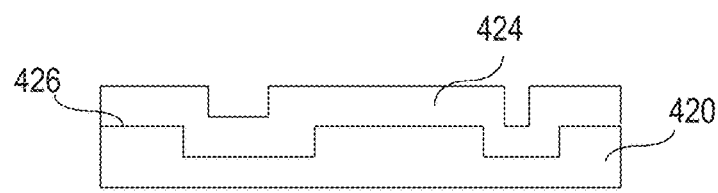

In various embodiments, as shown in FIG. 10B, a material 424 may be formed over the carrier 420 from the first side 426 of the carrier 420. Material, parameters, of the material 424, methods used for applying the material 424 etc. may be the same as those of the patterned mask 424 of the previous embodiments.

Figure 10C:
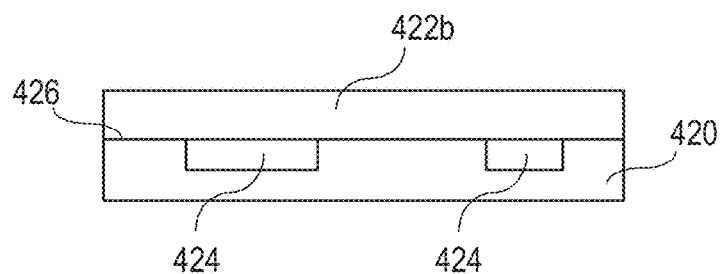

In various embodiments, as shown in FIG. 10C, a portion of the material 424 may be removed. The portion of the material 424 may for example be removed by means of etching, and/or by means of chemical-mechanical polishing. In various embodiments, the removal of the portion of the material 424 may be performed in such a way that a smooth surface, including a surface of the carrier 420 on the first side 426 of the carrier 420 and a surface of the material 424 remaining in the at least one opening 1380, may be formed. In this way, a patterned mask 424 may have been formed within the carrier 420.

In various embodiments, a material 422b may be formed over the carrier 420 and the patterned mask 424 from the first side 426 of the carrier 420. Material, parameters, of the material 422b, methods used for applying the material 422b etc. may be the same as those of the material 422b of the previous embodiments.

After the forming of the material 422b, the method for forming an opening structure 1300 may continue in similar ways to the methods for forming the opening structures in previous embodiments, for example the method for forming an opening structure 1300 may be followed by processes described in the context of FIG. 4B to FIG. 4D, and/or by processes described in the context of FIG. 5G and FIG. 5H, and/or by processes described in the context of FIG. 7D and FIG. 7E.

Figure 10D:
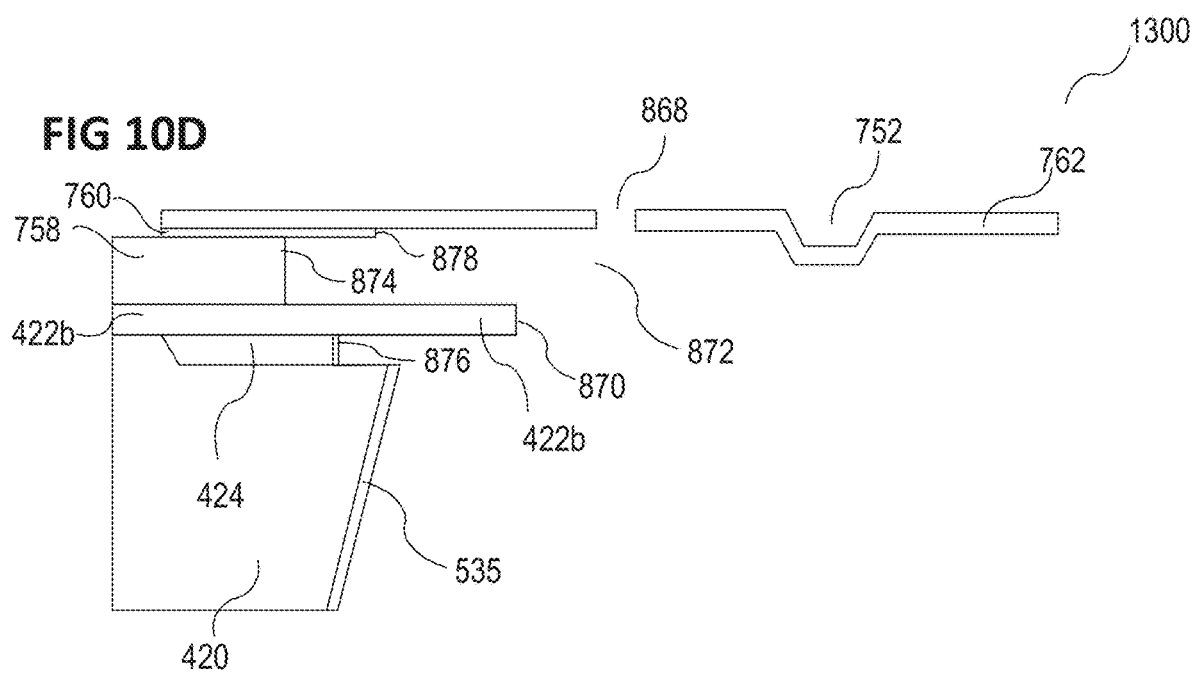

In various embodiments the opening structure 1300 shown in FIG. 10D may be formed using processes described in context with FIG. 10A to FIG. 10C. The opening structure may differ from the opening structures 600 and 900 shown in FIG. 6B and FIG. 8B, respectively, mainly in that the material 422 of the opening structures 600 and 900 is missing in the opening structure 1300. The carrier 420 of the opening structure 1300 may extend to a region in which the material 422 would be located in an opening structure according to opening structures 600 or 900.

Figure 11A:
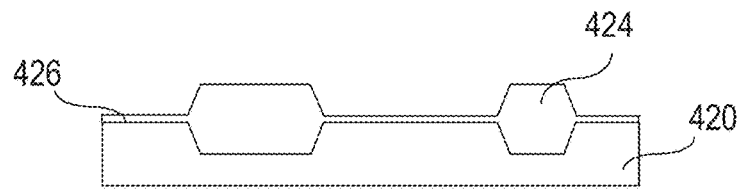
FIG. 11A to FIG. 11C show a process flow for a method for forming an opening structure in accordance with various embodiments.
Figure 11B:
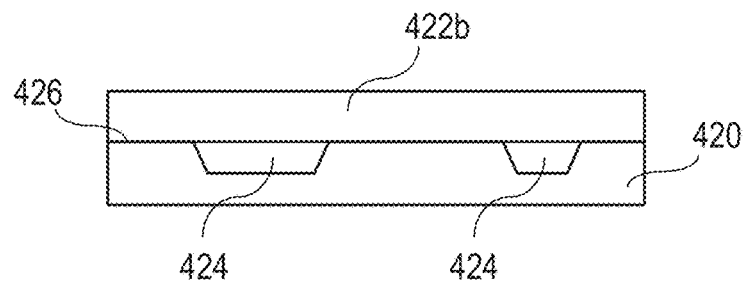
Figure 11C:
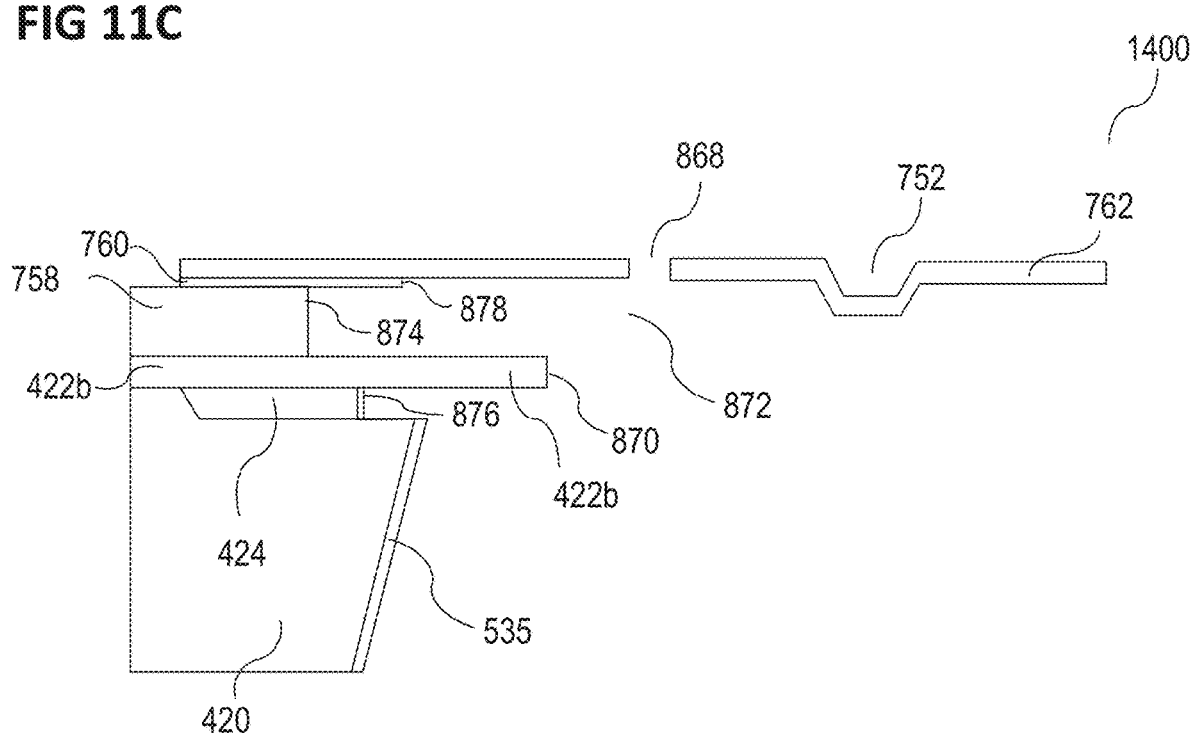

FIG. 11A to FIG. 11C show a process flow for a method for forming an opening structure 1400 and the opening structure 1400 in accordance with various embodiments.

In various embodiments, as shown in FIG. 11A, the method may include forming a material 424 for a patterned mask 424 in and over a carrier 420 from a first side 426 of the carrier 420. The carrier 420 may have the same properties as the carrier 420 of any of the previously described embodiments. In various embodiments, the carrier 420 may for example include or consist of silicon.

In various embodiments, the material 424 may be formed in and over the carrier 420 by means of a local oxidization of silicon (a so-called LOCOS-process). The forming of the material 424, in this case the oxidization of the carrier 420 in pre-defined regions located on the first side 426 of the carrier 420, may continue until the material 424—a silicon dioxide formed by means of the oxidization—extends to a depth into the carrier 420 that corresponds to a height of a structured mask 424 to be formed. The structured mask 424 to be formed may be similar, for example also in shape, to the structured mask 424 of the previously described embodiments, with the exception that the structured mask 424 in accordance with various presently described embodiments may be formed within the carrier 420, while the structured mask 424 of the previous embodiments was formed on the carrier 420. In this respect, the structured mask 424 of the presently described embodiments may be similar to the structured mask 424 of the opening structure 1300.

In various embodiments, as shown in FIG. 11B, a portion of the material 424 may be removed. The portion of the material 424 may for example be removed by means of etching, and/or by means of chemical-mechanical polishing. In various embodiments, the removal of the portion of the material 424 may be performed in such a way that a smooth surface, including a surface of the carrier 420 on the first side 426 of the carrier 420 and a surface of the material 424 remaining in the at least one opening 1380, may be formed. In this way, a patterned mask 424 may have been formed within the carrier 420.

In various embodiments, a material 422b may be formed over the carrier 420 and the patterned mask 424 from the first side 426 of the carrier 420. Material, parameters, of the material 422b, methods used for applying the material 422b etc. may be the same as those of the material 422b of the previous embodiments.

After the forming of the material 422b, the method for forming an opening structure 1400 may continue in similar ways to the methods for forming the opening structures in previous embodiments, for example the method for forming an opening structure 1400 may be followed by processes described in the context of FIG. 4B to FIG. 4D, and/or by processes described in the context of FIG. 5G and FIG. 5H, and/or by processes described in the context of FIG. 7D and FIG. 7E.

In various embodiments the opening structure 1400 shown in FIG. 10D may be formed using processes described in context with FIG. 10A to FIG. 10C. The opening structure may differ from the opening structures 600 and 900 shown in FIG. 6B and FIG. 8B, respectively, mainly in that the material 422 of the opening structures 600 and 900 is missing in the opening structure 1300. The carrier 420 of the opening structure 1400 may extend to a region in which the material 422 would be located in an opening structure according to opening structures 600 or 900. In this respect, the opening structure 1400 may be similar to the opening structure 1300.

FIG. 12 shows a schematic diagram of a method for forming an opening structure in accordance with various embodiments.

In various embodiments, the method may include, in 1572, forming a patterned mask in a carrier from a first side of a carrier. It may further include, in 1574, forming material over the first side of the carrier covering at least a portion of the carrier. The method may further include, in 1576, forming a first opening into the carrier from a second side of the carrier opposite the first side of the carrier to at least partially expose a surface of the patterned mask. It may further include, in 1578, forming a second opening into the material from the second side of the carrier using the patterned mask as a mask.

In various embodiments, the method may include further processing, for example according to various embodiments described in context with FIG. 4A to FIG. 4D, FIG. 5A to FIG. 5H, FIG. 6A, FIG. 6B, FIG. 7A to FIG. 7E, FIG. 8A and FIG. 8B.

In various embodiments, a method for manufacturing an opening structure is provided. The method may include: forming a patterned mask over a first side of a carrier; forming material over the first side of the carrier covering at least a portion of the carrier; forming a first opening in the carrier from a second side of the carrier opposite the first side of the carrier to at least partially expose a surface of the patterned mask; and forming a second opening in the material from the second side of the carrier using the patterned mask as a mask.

In various embodiments, forming material over the first side of the carrier may include forming material over the first side of the carrier covering at least a portion of the carrier and at least a portion of the patterned mask. In various embodiments, the material may be configured to have similar removal characteristics as the material of the carrier. In various embodiments, forming the patterned mask over the first side of the carrier may comprise forming a patterned hard mask. In various embodiments, the material of the carrier and the material may include the same material. In various embodiments, the material of the carrier may include silicon. In various embodiments, the material may include silicon. In various embodiments, the material may include polysilicon. In various embodiments, the first opening may be formed into the carrier such that at least a portion of a first mask portion of the patterned mask and at least a portion of a second mask portion of the patterned mask are exposed by the first opening. In various embodiments, at least one of the first opening and the second opening may be formed by means of an etching process. In various embodiments, at least one of the first opening and the second opening may be formed by means of a plasma etching process. In various embodiments, at least one of the first opening and the second opening may be formed by means of a wet etching process. In various embodiments, the first opening may be formed to have a larger width than the second opening. In various embodiments, the method may further include forming a front side structure over the first side of the material. In various embodiments, forming the front side structure may include forming at least one of a mechanical component and an electronic component over the first side of the material. In various embodiments, the method may further include forming a microphone comprising at least one of a group comprising the mechanical component and the electronic component. In various embodiments, at least one of the first opening and the second opening may be a trench.

In various embodiments, a device is provided. The device may include the features of: a carrier including a first side and a second side opposite the first side; a patterned mask formed over the first side of the carrier; a first opening formed in the carrier, wherein the first opening may extend between the first side of the carrier and the second side of the carrier, and wherein the first opening may be at least partially covered at a first end of the first opening by the patterned mask; a material formed over the carrier on the first side of the carrier; and a second opening formed in the material in fluid communication with the first opening.

In various embodiments, the second opening may extend through the material. In various embodiments, the device may further include a microphone. In various embodiments, the microphone may include a corrugation. In various embodiments, the patterned mask may include an oxide. In various embodiments, the patterned mask may include silicon dioxide.

In various embodiments, a method for manufacturing an opening structure is provided. The method may include: forming material over a first side of a carrier covering at least a portion of the carrier; forming a patterned mask over the material; forming a second material over the material covering at least a portion of the material; forming a first opening in the carrier from a second side of the carrier opposite the first side of the carrier to at least partially expose the material; forming a second opening in the material from the second side of the carrier, thereby at least partially exposing the patterned mask; and forming a third opening in the second material using the patterned mask as a mask.

In various embodiments, a method for manufacturing an opening structure is provided. The method may include: forming a patterned mask in a carrier from a first side of a carrier; forming material over the first side of the carrier covering at least a portion of the carrier; forming a first opening in the carrier from a second side of the carrier opposite the first side of the carrier to at least partially expose a surface of the patterned mask; and forming a second opening in the material from the second side of the carrier using the patterned mask as a mask.

In various embodiments, a device is provided. The device may include the features of: a carrier comprising a first side and a second side opposite the first side; a patterned mask formed in the carrier at the first side of the carrier; a first opening formed in the carrier, wherein the first opening extends between the first side of the carrier and the second side of the carrier, and wherein the first opening is at least partially covered at a first end of the first opening by the patterned mask; a material formed over the carrier on the first side of the carrier; and a second opening formed in the material in fluid communication with the first opening.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims, and all changes which come within the meaning and range of equivalency of the claims are therefore intended to be embraced.

What is claimed is:

1. A device, comprising:
   a carrier comprising a first side and a second side opposite the first side;
   a patterned mask contacting the first side of the carrier;
   a first opening extending through the carrier from the first side of the carrier to the second side of the carrier, wherein the first opening is at least partially covered at the first side of carrier by the patterned mask;
   a material enclosing the patterned mask over the first side of the carrier;
   a second opening formed in the material that is in fluid communication with the first opening; and
   a front side structure over a first side of the material facing away from the carrier,
   wherein the second opening extends through the material to meet a surface of the front side structure facing towards the carrier so that the front side structure directly covers the second opening,
   wherein a virtual plane of a sidewall of the second opening extends continuously and coincidently with a virtual plane of the first side of the carrier to the front side structure, and
   wherein the front side structure comprises a membrane that covers the second opening, and wherein the second opening is a cavity directly exposed to the membrane so as to allow the membrane to move into and out of the second opening.

2. The device of claim 1, wherein the patterned mask comprises an oxide.

3. The device of claim 2, wherein the patterned mask comprises silicon dioxide.

4. The device of claim 1, wherein the patterned mask comprises carbon.

5. The device of claim 1, wherein the patterned mask comprises at least one opening through the patterned mask.

6. The device of claim 1, wherein the material directly contacts the carrier at the first side.

7. The device of claim 6, wherein the material covers and contacts one or more outer sidewalls of the patterned mask.

8. The device of claim 1, wherein a lateral width of the first opening is larger than a lateral width of the second opening, the lateral widths being measured along a direction parallel to the first side of the carrier.

9. The device of claim 1, wherein the front side structure comprises a microphone.

10. The device of claim 9, wherein the microphone comprises a corrugation.

11. The device of claim 1, wherein a virtual plane, that coincides with a sidewall of the first opening and extends beyond the carrier towards the patterned mask, intersects the patterned mask.

12. The device of claim 1, wherein the first opening has a lateral width of the opening that increases continuously from the second side of the carrier to the first side of the carrier, the lateral width being measured in a direction parallel to the first side of the carrier.

13. The device of claim 1, wherein the first opening is formed into the carrier so that at least a portion of a first mask portion of the patterned mask facing the carrier and at least a portion of a second mask portion of the patterned mask facing the carrier are exposed by the first opening through the carrier in a direction perpendicular to the first side of the carrier.

14. The device of claim 1, wherein the second opening is the only opening in a cross-section of the material.

* * * * *